United States Patent
Wu et al.

(10) Patent No.: US 12,217,664 B2
(45) Date of Patent: Feb. 4, 2025

(54) UNDER-DISPLAY CAMERA ASSEMBLY AND CORRESPONDING TERMINAL DEVICE

(71) Applicant: NINGBO SUNNY OPOTECH CO., LTD, Zhejiang (CN)

(72) Inventors: Xudong Wu, Zhejiang (CN); Liao Jing, Zhejiang (CN); Siyuan Liu, Zhejiang (CN)

(73) Assignee: NINGBO SUNNY OPOTECH CO., LTD., Zhejiang (CN)

( * ) Notice: Subject to any disclaimer, the term of this patent is extended or adjusted under 35 U.S.C. 154(b) by 726 days.

(21) Appl. No.: 17/599,194

(22) PCT Filed: Feb. 25, 2020

(86) PCT No.: PCT/CN2020/076573
§ 371 (c)(1),
(2) Date: Sep. 28, 2021

(87) PCT Pub. No.: WO2020/192336
PCT Pub. Date: Oct. 1, 2020

(65) Prior Publication Data
US 2022/0196890 A1     Jun. 23, 2022

(30) Foreign Application Priority Data

Mar. 28, 2019  (CN) .......................... 201910241353.3
Mar. 28, 2019  (CN) .......................... 201910241425.4

(51) Int. Cl.
*G02B 26/02*       (2006.01)
*G02B 5/00*        (2006.01)
(Continued)

(52) U.S. Cl.
CPC ........... *G09G 3/3208* (2013.01); *G02B 5/005* (2013.01); *G02B 7/021* (2013.01); *G03B 30/00* (2021.01); *G06V 10/14* (2022.01)

(58) Field of Classification Search
CPC ...... G09G 3/3208; G02B 5/005; G02B 7/021; G03B 30/00; G03B 9/02; G06V 10/14;
(Continued)

(56) References Cited

U.S. PATENT DOCUMENTS 10,027,865 B1    7/2018  Tsai et al.
2004/0263670 A1  12/2004 Yamasaki
(Continued)

FOREIGN PATENT DOCUMENTS

CN         1786816       6/2006
CN       104536179       4/2015
(Continued)

OTHER PUBLICATIONS

Yi-Jiun Chen et al., "A Vision toward Ultimate Optical Out-Coupling for Organic Light-Emitting Diode Displays: 3D Pixel Configuration", Advanced Science, vol. 5, No. 10, 2018, pp. 1-12.
(Continued)

*Primary Examiner* — Euncha P Cherry
(74) *Attorney, Agent, or Firm* — Wenderoth, Lind & Ponack, L.L.P.

(57) ABSTRACT

The present application provides an under-display camera assembly, including: an organic light-emitting diode display screen, wherein a display region of said display screen includes an under-display camera region and a non-under-display camera region, and a pixel density of the under-display camera region is configured to be less than that of the non-under-display camera region; and a camera module located at a rear end of the under-display camera region, and including an iris diaphragm, a lens group, and a photosensitive component, wherein the iris diaphragm is provided between a bottom surface of a pixel light-emission layer and a top surface of the foremost lens of the lens group, and has a closed state and a transmission state. The iris diaphragm,
(Continued)

in the closed state, reflects light from the display screen or emits light by itself from the front of the display screen, and the transmission state refers to a state in which a light path of the camera module is opened. The application further provides a corresponding terminal device. The application can produce full-screen display effects, provide an added aperture adjustment function, and facilitate alignment during an assembly process.

19 Claims, 9 Drawing Sheets

(51) Int. Cl.
    *G02B 7/02*         (2021.01)
    *G03B 30/00*       (2021.01)
    *G09G 3/3208*     (2016.01)
    *G06V 10/14*      (2022.01)

(58) Field of Classification Search
    CPC ........ H04N 23/55; H04N 23/57; H10K 59/65; H04M 1/0266; H04M 1/0264
    See application file for complete search history.

(56) References Cited

U.S. PATENT DOCUMENTS

| | | | |
|---|---|---|---|
| 2009/0174333 A1 | 7/2009 | Hayakawa et al. | |
| 2014/0312321 A1 | 10/2014 | Yoo et al. | |
| 2016/0343787 A1 | 11/2016 | Wu | |
| 2017/0353638 A1* | 12/2017 | Konttori | G02B 27/0006 |
| 2019/0027547 A1 | 1/2019 | Kim et al. | |
| 2019/0051711 A1 | 2/2019 | Lee et al. | |
| 2019/0173059 A1 | 6/2019 | Liu et al. | |
| 2019/0326366 A1 | 10/2019 | Fan et al. | |
| 2019/0373166 A1* | 12/2019 | Jia | G09G 3/2003 |
| 2019/0393286 A1 | 12/2019 | Ding et al. | |
| 2020/0050822 A1 | 2/2020 | Guo | |
| 2020/0066809 A1 | 2/2020 | Liu | |
| 2020/0111401 A1 | 4/2020 | Zhao et al. | |
| 2020/0310210 A1 | 10/2020 | Zhang et al. | |
| 2021/0065625 A1 | 3/2021 | Wang et al. | |
| 2021/0233438 A1 | 7/2021 | Mao et al. | |
| 2021/0336225 A1 | 10/2021 | Ke | |
| 2021/0408146 A1 | 12/2021 | Ying et al. | |

FOREIGN PATENT DOCUMENTS

| | | |
|---|---|---|
| CN | 106449701 | 2/2017 |
| CN | 106783927 | 5/2017 |
| CN | 106921767 | 7/2017 |
| CN | 206674022 | 11/2017 |
| CN | 207264695 | 4/2018 |
| CN | 108376696 | 8/2018 |
| CN | 108461521 | 8/2018 |
| CN | 108648679 | 10/2018 |
| CN | 108650443 | 10/2018 |
| CN | 108769304 | 11/2018 |
| CN | 108810201 | 11/2018 |
| CN | 109036245 | 12/2018 |
| CN | 109067951 | 12/2018 |
| CN | 109074491 | 12/2018 |
| CN | 208271897 | 12/2018 |
| CN | 109327576 | 2/2019 |
| CN | 109509781 | 3/2019 |
| CN | 110047876 | 7/2019 |
| CN | 110444570 | 11/2019 |
| CN | 110649085 | 1/2020 |
| CN | 111756880 | 10/2020 |
| EP | 1 670 240 | 6/2006 |
| EP | 3 333 628 | 6/2018 |
| EP | 3 428 967 | 1/2019 |
| EP | 3 579 539 | 12/2019 |
| EP | 3 623 921 | 3/2020 |
| EP | 3 907 770 | 11/2021 |
| TW | 201839745 | 11/2018 |
| TW | 201839977 | 11/2018 |
| WO | 2014/042804 | 3/2014 |
| WO | 2018/205804 | 11/2018 |
| WO | 2019/062236 | 4/2019 |
| WO | 2020/191555 | 10/2020 |

OTHER PUBLICATIONS

International Search Report issued May 22, 2020, in International (PCT) Application No. PCT/CN2020/076573, with English translation.

Office Action issued Oct. 5, 2023 in U.S. Appl. No. 17/599,185.

Office Action issued Jan. 3, 2023 in U.S. Appl. No. 17/599,220.

* cited by examiner

UNDER-DISPLAY CAMERA ASSEMBLY AND CORRESPONDING TERMINAL DEVICE

CROSS REFERENCES TO RELATED APPLICATIONS

The present application claims the priority of the Chinese patent application No. 201910241353.3 with the title of "Under-Display Camera Assembly and Corresponding Terminal Device", filed on Mar. 28, 2019, and the priority of the Chinese patent application No. 201910241425.4 with the title of "Under-Display Camera Assembly and Corresponding Terminal Device", filed on Mar. 28, 2019, and the entire content of these two applications are incorporated herein by reference.

FIELD OF THE INVENTION

The present application relates to optical imaging technology and display technology. In particular, the present application relates to an under-display camera assembly and a corresponding terminal device.

BACKGROUND OF THE INVENTION

In order to meet the camera needs of customers, electronic terminals including mobile phones usually have camera functions. For this reason, the existing mobile phone terminals generally have front and rear camera modules, and front camera modules are usually arranged on the same side of a display screen to satisfy the user's Selfie function, etc. However, as the screen-to-body ratio becomes larger and larger, higher and higher requirements are placed on a layout of the front camera. In order to reduce the impact of the camera on the screen-to-body ratio and achieve a full screen, different manufacturers have developed a variety of solutions from different perspectives. One technical direction is to arrange the front camera module on the top frame of the mobile phone to form a notch or water drop screen that is close to the full screen. Another technical direction is to employ a telescopic camera module to hide and use the camera. When shooting is required, the camera can be controlled to extend out of the casing of the mobile phone (or other electronic device) for shooting; after the shooting is completed, the camera is retracted into the casing of the mobile phone (or other electronic device). However, the camera is prone to be impacted by external forces during a continuous expansion and contraction process. And when the camera is extended relative to the mobile phone (or other electronic device), damage can be caused to the front camera and replacement is difficult.

In recent months, some manufacturers have introduced under-display camera solutions, commonly known as "perforated screen". The technology is: punching through holes or blind holes in the display screen, and placing the front camera module at the through holes or behind the blind holes. This technology can eliminate the need for telescopic motors and help improve product reliability. However, in this technology, the "perforated" position of the display screen cannot be used for display, resulting in insufficient visual impact, and the user experience needs to be further improved. On the other hand, in the field of display technology, organic light-emitting diode displays (i.e., OLED screens, wherein OLED is the abbreviation of Organic Light-Emitting Diode) can emit light without a backlight, and OLED screens are transparent to a certain extent. However, unlike glass, resin and other lens materials, OLED screens have complex microstructures inside. These microstructures include, for example, a large number of light-emitting structures fabricated on a substrate based on semiconductor process and corresponding micro-circuit structures for controlling the light-emitting structure. The complex microstructure inside the screen causes the light transmittance of the OLED screen to be much lower than that of glass, resin and other lens materials. If the front camera module is arranged at the back end of the existing OLED screen, the OLED screen (although it has a certain light transmittance) will still block the front camera module and cannot perform imaging.

In summary, consumers are eager for a full-screen solution. However, in the prior art, whether it is a notch, a water drop screen, a "perforated screen", or a telescopic proactive solution, all of them have their own shortcomings. Therefore, there is an urgent need in the current market for an under-display camera solution that can truly realize a full screen.

To solve the above problems, a solution is to specially design some regions of the OLED screen, so that the light transmittance and other related characteristics can reach a higher standard, so that the under-display camera module can perform imaging. However, even if an OLED screen with a suitable under-display camera region is successfully made, how to align this region with the under-display camera module during assembly is still a big problem. Let's take a smart phone as an example for description.

The imaging of the existing camera module has nothing to do with the screen. During installation, the camera module can only be embedded on a main board of the mobile phone. However, when applied to the under-display camera assembly, since the screen and the module need to be strictly aligned with a light path, they need to be assembled in a tightly matched manner. However, the distance between the main board of the mobile phone and the OLED screen is often not equal to a height of the camera module. For example, when the bottom of the camera module is installed on the main board of the mobile phone, there may be a gap between the top of the camera module and the OLED screen, which makes it very difficult to align the camera module with the light-transmitting region of the OLED screen.

Therefore, there is an urgent need for an under-display camera solution that facilitates the accurate assembly of the OLED screen and the camera module in the current market.

Further, it is expected that the camera module in the mobile phone or other terminal device has more and more powerful functions, such as aperture adjustment function.

SUMMARY OF THE INVENTION

The present invention is to provide a solution that can overcome at least one of the drawbacks of the prior art.

According to one aspect of the present invention, there provides an under-display camera assembly, including: an organic light-emitting diode display screen, a display area of which includes an under-display camera area and a non-under-display camera area, wherein a pixel density of the under-display camera area is set to be smaller than a pixel density of the non-under-display camera area; and a camera module, an optical axis of which is perpendicular to a surface of the organic light-emitting diode display screen, and the camera module being located at a rear end of the under-display camera area, and the camera module including an iris diaphragm, a lens group and a photosensitive assembly, wherein the organic light-emitting diode display screen includes a pixel light-emitting layer, and the iris diaphragm is arranged between a bottom surface of the pixel light-emitting layer and a top surface of a foremost lens of the lens group, and the iris diaphragm has a closed state and a transmission state, and the iris can be controllably switched between the closed state and the transmission state, wherein the closed state is a state in which the iris diaphragm closes an optical path of the camera module, and, in the closed state, the iris diaphragm reflects light from the organic light-emitting diode display screen or the iris diaphragm itself emits light and the emitted light is emitted from the front of the organic light-emitting diode display screen, and the transmission state is a state in which the iris diaphragm opens the light path of the camera module.

Wherein, the closed state is a reflective state, and the under-display camera assembly further includes a switching control unit, which is used to control the iris diaphragm to switch to the transmission state under a working state of the camera module, and to control the iris diaphragm to switch to the reflection state under a non-working state of the camera module.

Wherein, the camera module further includes a lens barrel, and the lens group is installed on an inner side surface of the lens barrel.

Wherein, the iris diaphragm includes a first lens holder and a plurality of movable blades installed on the first lens holder, and an upper surface of the movable blade has a reflective film, and the reflective state is achieved by closing the plurality of movable blades together, and the transmission state is achieved by accommodating the plurality of movable blades in the first lens holder.

Wherein, a top surface of the first lens holder bears against a bottom surface of the organic light-emitting diode display screen, and a bottom surface of the first lens holder bears against a top surface of the lens barrel.

Wherein, the lens barrel includes: a lens group installation section, the lens group being installed on an inner side surface of the lens group installation section; and an extension section, which is formed by extending upward from a top portion of the lens group installation section, and a top surface of the extension section bearing against the bottom surface of the organic light-emitting diode display screen.

Wherein, the iris diaphragm is installed on the extension section.

Wherein, the iris diaphragm is installed on the bottom surface of the organic light-emitting diode display screen; and there is no gap between an outer side surface of the iris diaphragm and an inner side surface of the extension section, or the gap between the outer side surface of the iris diaphragm and the inner side surface of the extension section is blocked by a black object.

Wherein, a height of the first lens holder is determined based on a total optical length of the camera module, and a distance from a photosensitive surface of the camera module to a bottom installation surface of the camera module, and a distance from the bottom installation surface of the camera module to the bottom surface of the organic light-emitting diode display screen, and the height is a size in an optical axis direction.

Wherein, a height of the extension section is determined based on the total optical length of the camera module, the distance from the photosensitive surface of the camera module to the bottom installation surface of the camera module, and the distance from the installation surface of the camera module to the bottom surface of the organic light-emitting diode display screen, and the height is a size in the optical axis direction.

Wherein, the organic light-emitting diode display screen has a back plate; and the bottom surface of the organic light-emitting diode display screen is a bottom surface of the back plate, or a position of the back plate corresponding to under-display camera area is removed, and the bottom surface of the organic light-emitting diode display screen is a bottom surface of the organic light-emitting diode display screen exposed after the back plate is removed.

Wherein, a top portion of the extension section has an expansion portion formed by extending along a radial direction, so that a width of the top surface of the extension section is larger than an average thickness of the extension section, and the radial direction is a direction perpendicular to the optical axis, and the width of the top surface is a size of the top surface in the radial direction.

Wherein, the iris diaphragm includes a MEMS micromirror or a highly elastic reflective film.

Wherein, a pixel pitch of the under-display camera area is set to be greater than a pixel pitch of the non-under-display camera area, and the pixel pitch is a pitch between light-emitting structures of adjacent pixels of the organic light-emitting diode display screen.

Wherein, the under-display camera assembly further includes a first control unit, which is used to control both of the under-display camera area and the non-under-display camera area to display images in a non-working state of the camera module; and to control a display function of the under-display camera area to be turned off under a working state of the camera module.

Wherein, the under-display camera assembly further includes a second control unit, which is used to compensate brightness of the under-display camera area when both of the under-display camera area and the non-under-display camera area display images.

Wherein, the under-display camera assembly further includes a second control unit, which is used to compensate a display parameter of the under-display camera area when both of the under-display camera area and the non-under-display camera area display images, so that the displayed image transits smoothly between the under-display camera area and the non-under-display camera area. According to another aspect of the present application, there also provides a terminal device, including any of the above-mentioned under-display camera assembly.

Wherein, the camera module is used as a front camera module of the terminal device, and the organic light-emitting diode display screen is used as a display panel on the front of the terminal device.

Compared with the prior art, the present application has at least one of the following technical effects:

1. The present application can increase the light transmittance of the under-display camera area by reducing the pixel density of the under-display camera area, so that the screen can avoid an imaging light path of the camera module without punching holes to maintain the integrity of the display screen.

2. In the present application, a physical iris diaphragm can be provided between the lens barrel and the bottom surface of the display screen, and a reflection function can be configured in the physical diaphragm, so as to compensate for the brightness of the under-display camera area of the display screen, thereby making the under-display camera area and the non-under-display camera area of the display screen can be continuously transited (that is, to avoid dark spots), forming a complete full-screen display effect with greater visual impact.

3. In the present application, the camera module can be added an aperture adjustment function.

4. The present application can compensate for the inconsistency between a reserved height of the mobile phone and a height of the camera module through a height design of the lens holder of the physical iris diaphragm, so that the camera module can accurately align the under-display camera area.

5. The present application can compensate for the inconsistency between the reserved height of the mobile phone and the height of the camera module through the height design of the lens holder of the physical iris diaphragm, so that the lens group of the same optical design can be adapted to multiple models of the terminal device with different sizes (such as multiple models of mobile phones with different thicknesses).

6. In the present application, the extension portion (i.e., extension section) can be arranged on the top portion of the lens barrel to make the screen and the camera module bear against each other, so that the camera module can be accurately aligned with the under-display camera area.

7. In the present application, the extension portion (i.e., extension section) can be arranged on the top portion of the lens barrel, so that the lens group of the same optical design can be adapted to multiple models of terminal devices with different sizes (for example, multiple models of mobile phones with different thicknesses).

8. In the present application, the under-display camera area and the non-under-display camera area (also referred to as the under-display non-camera area) can jointly form a complete picture, truly realizing a full-screen display effect.

9. The under-display camera assembly of the present application is particularly suitable for use in the smart phone, and the camera module in the under-display camera assembly is particularly suitable as a front camera module of the smart phone.

BRIEF DESCRIPTION OF THE DRAWINGS

Exemplary embodiments are shown in the referenced drawings. The embodiments and drawings disclosed herein should be regarded as illustrative rather than restrictive.

DETAIL DESCRIPTION OF THE INVENTION

Figure 1:
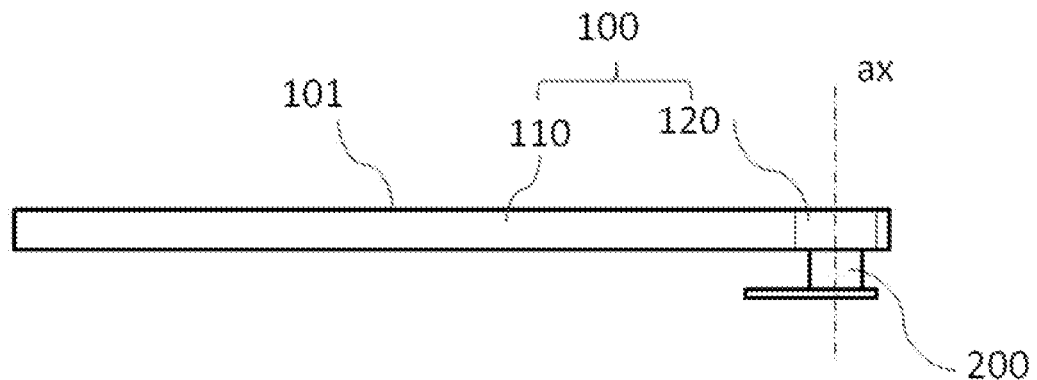
FIG. 1 shows a schematic cross-sectional view of an under-display camera assembly according to an embodiment of the present application.

In order to better understand the present application, various aspects of the present application will be described in more detail with reference to the accompanying drawings. It should be understood that these detailed descriptions are only descriptions of exemplary embodiments of the present application, and are not intended to limit the scope of the present application in any way. Throughout the specification, the same reference numerals refer to the same elements. The expression "and/or" includes any and all combinations of one or more of the associated listed items.

It should be noted that in this specification, expressions such as first, second, etc. are only used to distinguish one feature from another feature, and do not represent any restriction on the feature. Therefore, without departing from the teachings of the present application, the first subject discussed below may also be referred to as the second subject.

In the drawings, the thickness, size, and shape of objects have been slightly exaggerated for ease of description. The drawings are only examples and are not drawn strictly to scale.

It should also be understood that the terms "include", "including", "have", "comprise", and/or "comprising", when used in this specification, mean that the stated features, wholes, steps, operations, elements, and/or components are present, but do not exclude the presence or addition of one or more other features, wholes, steps, operations, elements, components, and/or combinations thereof. In addition, when expressions such as "at least one of . . . " appear before a list of listed features, the entire listed feature is modified, rather than the individual elements in the list. In addition, when describing the embodiments of the present application, the use of "may" means "one or more embodiments of the present application". And, the term "exemplary" is intended to refer to an example or illustration.

As used herein, the terms "substantially", "approximately", and similar terms are used as approximate terms, not as terms representing degree, and are intended to illustrate inherent deviations in measured or calculated values that will be recognized by those of ordinary skill in the art.

Unless otherwise defined, all terms (including technical terms and scientific terms) used herein have the same meanings as commonly understood by those of ordinary skill in the art to which the present application belongs. It should also be understood that terms (such as those defined in commonly used dictionaries) should be interpreted as having meanings consistent with their meanings in the context of related technologies, and will not be interpreted in an idealized or excessively formal sense unless this is clearly defined in this article.

It should be noted that the embodiments in the present application and the features in the embodiments can be combined with each other if there is no conflict. Hereinafter, the present application will be described in detail with reference to the drawings and in conjunction with the embodiments.

Figure 2:
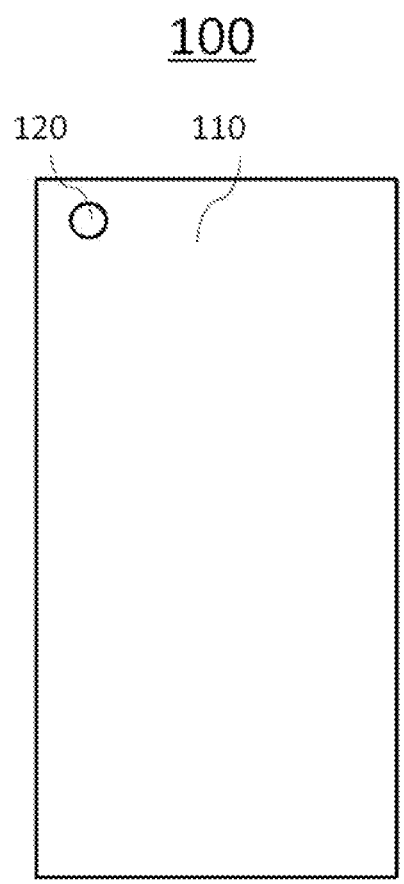
FIG. 2 shows a schematic top view of the organic light-emitting diode display screen in FIG. 1.
Figure 3:
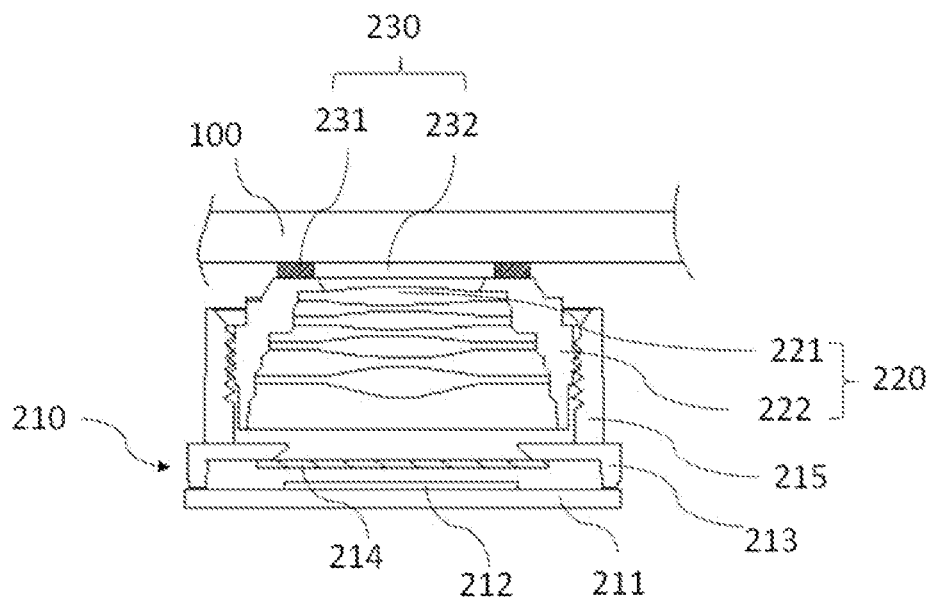
FIG. 3 shows a schematic cross-sectional view of an under-display camera assembly with an enlarged specific structure of a camera module in an embodiment of the application.

FIG. 1 shows a schematic cross-sectional view of an under-display camera assembly according to an embodiment of the present application. Referring to FIG. 1, the under-display camera assembly includes an organic light-emitting diode display screen 100 (i.e., an OLED screen) and a camera module 200 located at a rear end of the organic light-emitting diode display screen 100. An optical axis ax of the camera module 200 is substantially perpendicular to a surface 101 of the organic light-emitting diode display screen 100. Here, the "rear end" refers to an end of an imaging optical path of the camera module 200 close to an image side. The camera module 200 is located at a rear end of an under-display camera area 120 of the organic light-emitting diode display screen 100. Wherein, the under-display camera area 120 is an area in the organic light-emitting diode display screen 100 that is adapted to the camera module 200. Further, FIG. 2 shows a schematic top view of the organic light-emitting diode display screen in FIG. 1. Referring to FIG. 2, a display area of the organic light-emitting diode display screen includes the under-display camera area 120 and a non-under-display camera area 110. The under-display camera area 120 may be circular, and its size may be adapted to a size of the camera module 200. The under-display camera area 120 may be surrounded by the non-under-display camera area 110. In this embodiment, a pixel density of the under-display camera area 120 (sometimes referred to as PPI in the industry, and its full name is Pixels Per Inch) is set to be smaller than a pixel density of the non-under-display camera area 110, so as to improve a light transmittance of the under-display camera area 120. In this way, the screen can avoid an imaging light path of the camera module without punching holes, so that the display screen remains intact. Moreover, since a light-emitting structure and the corresponding microcircuit can be retained, when the camera module is not used, the under-display camera area 120 can perform image display. The under-display camera area 120 and the non-under-display camera area 110 can jointly form a complete picture, truly realizing the full-screen display effect. The under-display camera assembly of this embodiment is particularly suitable for use in a smart phone, and the camera module in the under-display camera assembly is particularly suitable for use as a front camera module of the smart phone. Further, FIG. 3 shows a schematic cross-sectional view of an under-display camera assembly with an enlarged specific structure of a camera module in an embodiment of the present application. Referring to FIG. 3, in this embodiment, the camera module includes an iris diaphragm 230, a lens barrel 222, a lens group 221 and a photosensitive assembly 210. The iris diaphragm 230 is provided between a bottom surface of the organic light-emitting diode display screen 100 and a top surface of a frontmost lens of the lens group 221. The iris diaphragm 230 has a reflective state and a transmission state, and the iris diaphragm can be switched controllably between the reflective state and the transmission state, wherein the reflective state is a state in which the iris diaphragm closes the optical path of the camera module and reflects the light from the organic light-emitting diode display screen, and the transmission state is a state in which the iris diaphragm opens the optical path of the camera module. The under-display camera assembly may also include a switching control unit, which is used to control the iris diaphragm to switch to the transmission state under a working state of the camera module, and control the iris diaphragm to switch to the reflection state under a non-working state of the camera module.

Figure 4A:
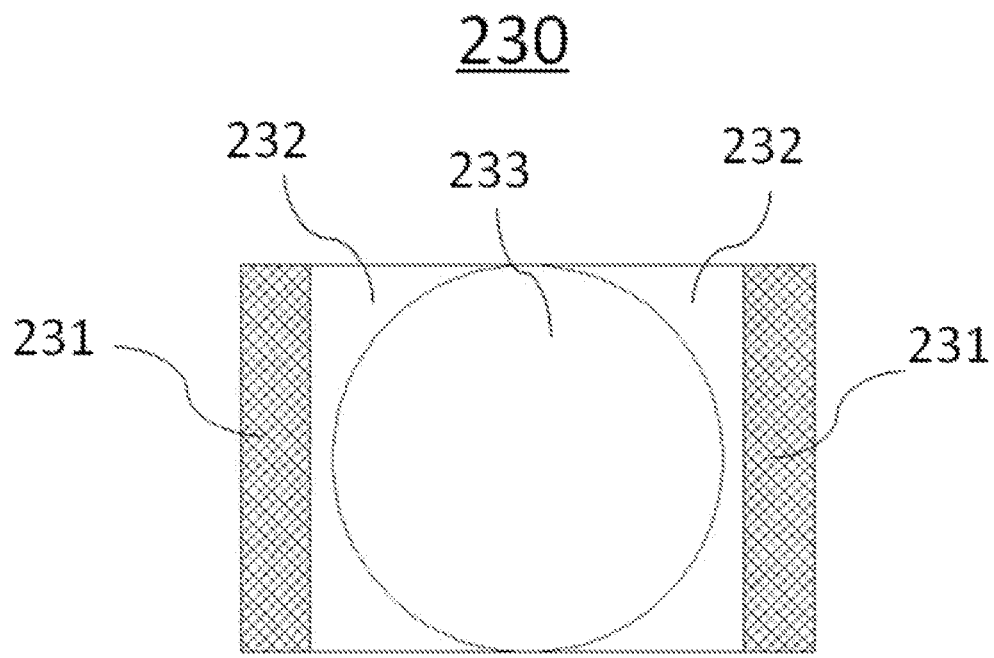
FIG. 4A shows a schematic top view of an iris diaphragm 230 in a large aperture state.
Figure 4B:
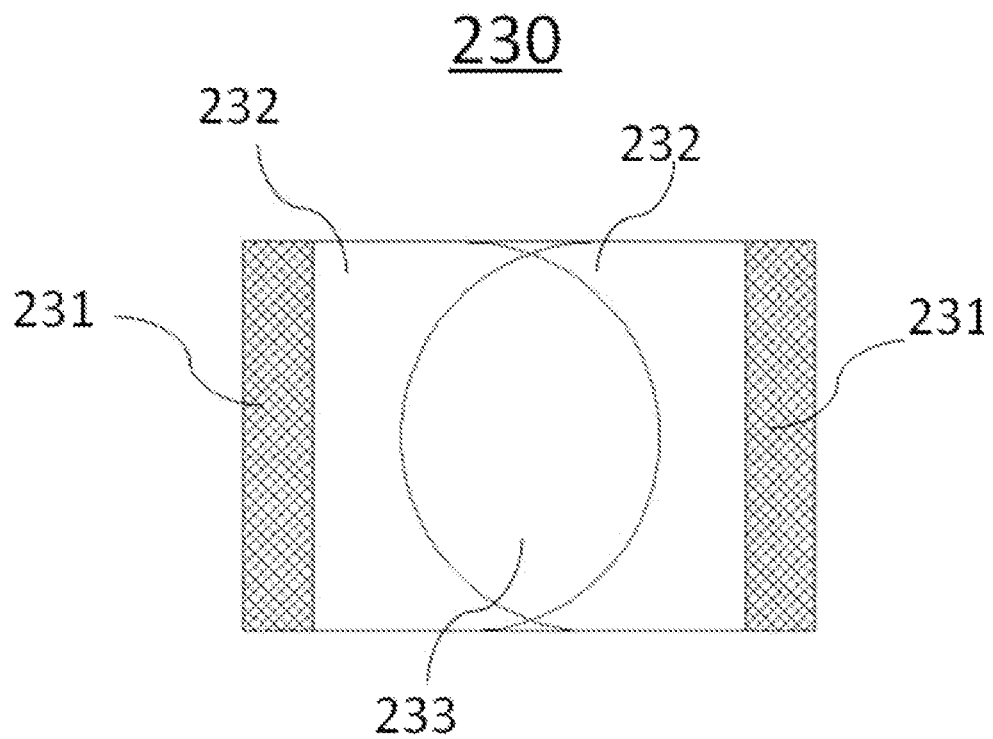
FIG. 4B shows a schematic top view of the iris diaphragm 230 in a small aperture state.
Figure 4C:
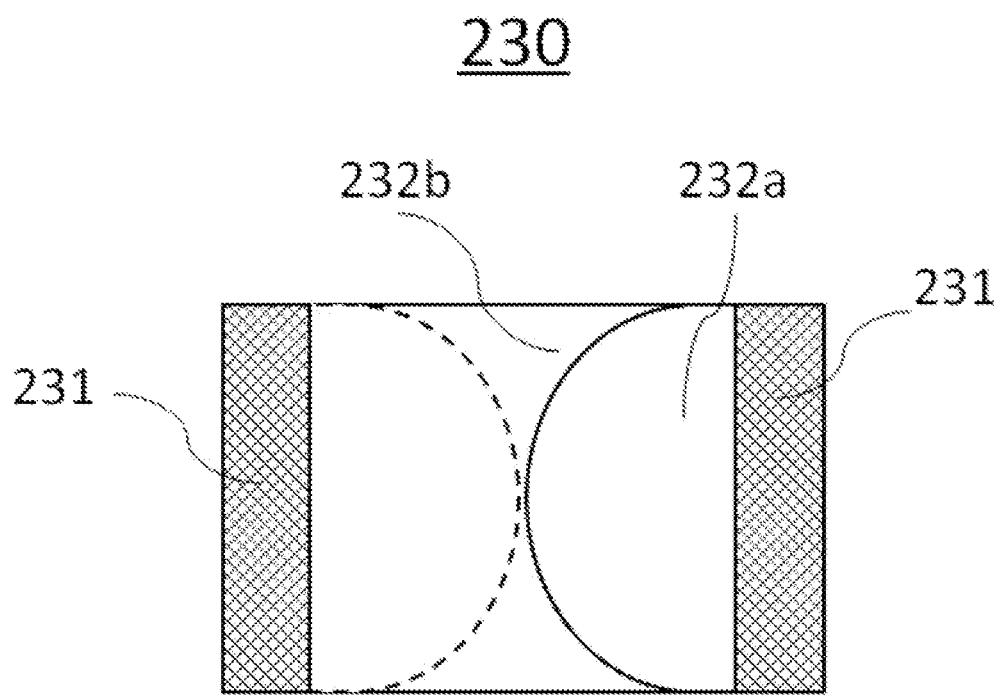
FIG. 4C shows a schematic top view of the iris diaphragm 230 in a closed state.

Further, still referring to FIG. 3, in an embodiment of the present application, the iris diaphragm 230 includes a first lens holder 231 and a plurality of movable blades 232 installed on the first lens holder 231. FIG. 3 is a schematic cross-sectional view. In the top view, the plurality of movable blades 232 can be seen more clearly. FIG. 4A shows a schematic top view of the iris diaphragm 230 in a large aperture state. FIG. 4B shows a schematic top view of the iris diaphragm 230 in a small aperture state. FIG. 4C shows a schematic top view of the iris diaphragm 230 in a closed state. In FIG. 4C, a part of a right blade 232a is blocked by a left blade 232b, and therefore, a part of the outline of the right blade 232a is shown by a dotted line. Referring to FIGS. 3 and 4A-4C, the first lens holder 231 may include a driving module, and a root part of the blade 232 is connected to the driving module. It should be noted that although the number of blades in FIGS. 4A-4C is two, the present application is not limited to this. In other embodiments, the number of blades of the iris diaphragm 230 can also be three, four or more. A shape of the blade can also be adjusted accordingly. An upper surface of the movable blade 232 may have a reflective film, and the reflection state is realized by closing the plurality of movable blades 232 together, that is, the reflection state can be realized in the closed state shown in FIG. 4C. The transmission state is achieved by accommodating the plurality of movable blades 232 in the first lens holder 231, such as the large aperture state shown in FIG. 4A. The transmission state may be that all the blades are accommodated in the first lens holder 231, or a part of the blade (for example, the root part of the blade) is accommodated in the first lens holder 231 (for example, as shown in FIGS. 4A and 4B). There may also be a driving component in the first lens holder for driving the blade to move. According to different moving distances, the plurality of movable blades can form a variety of apertures of different sizes, so as to realize the function of aperture adjustment, that is, the aperture size of the diaphragm can be adjusted (refer to FIGS. 4A-C). In this embodiment, the lens barrel 222 and the lens group 221 may constitute an optical lens. The photosensitive assembly 210 includes a photosensitive chip 212 for collecting and outputting image data. Specifically, in this embodiment, the photosensitive assembly 210 may include a circuit board 211, a photosensitive chip 212, a second lens holder 213, a color filter 214, and a lens barrel holder 215, and the photosensitive chip 212 may be installed on (for example, attached to) a surface of the circuit board 211. The second lens holder 213 is installed on a surface of the circuit board and surrounds the photosensitive chip 212, and a top surface of the second lens holder 213 is installed with a lens barrel holder 215. The lens barrel holder 215 may be cylindrical and have internal threads, and the lens barrel 222 may have external threads, so that the lens barrel 222 can be fixed to the lens barrel holder 215 by a screw connection. The color filter 214 can be installed on the second lens holder 213.

Further, in an embodiment of the present application, a top surface of the first lens holder 231 bears against the bottom surface of the organic light-emitting diode display screen 100, and a bottom surface of the first lens holder 231 bears against a top surface of the lens barrel 222. The top surface of the first lens holder 231 can be bonded to the bottom surface of the organic light-emitting diode display screen 100. The bottom surface of the first lens holder 231 can also be bonded to the top surface of the lens barrel 222. A height of the first lens holder 231 can be determined based on a total optical length of the camera module, a distance from a photosensitive surface of the camera module (a photosensitive surface of the photosensitive chip) to a bottom installation surface of the camera module, and a distance from the bottom installation surface of the camera module and the bottom surface of the organic light-emitting diode display screen, and the height is a size in an optical axis direction.

It should be noted that in the above embodiment, a position of a reflective surface is actually located between the display screen and a first lens of the lens group. Under this design, a downward light beam emitted by a pixel must first pass through a TFT layer to reach the reflective surface. A microstructure of the TFT layer (or TFT switch unit) is more complicated, which may cause light to diverge to a certain extent. Therefore, this is not a common (or easy to think of) design location of the reflective surface. However, the pixel density of the under-display camera area of the present invention is reduced, and it happens to have a relatively large pixel pitch, so this divergence will not (or not easily) cause light of adjacent pixels to interfere with each other. In addition, if reflected light passes through the display screen from a gap between the pixels, it also happens to take advantage of a high light transmittance of the gap between the pixels. In summary, the solution of the present application very cleverly combines many technical features, so that the under-display camera assembly can achieve multiple technical effects at the same time. Specifically, in the above-mentioned embodiment, the light transmittance of the under-display camera area can be increased by reducing the pixel density of the under-display camera area, so that the screen can avoid the imaging light path of the camera module without punching holes to maintain the integrity of the display screen. The physical iris diaphragm is provided between the lens barrel and the bottom surface of the display screen, and the reflection function is configured in the physical diaphragm, which can compensate the brightness of the under-display camera area of the display screen, and make the under-display camera area and non-under-display camera area of the display screen to be continuously transited (that is, to avoid dark spots), forming a complete full-screen display effect with greater visual impact. In addition, in the above-mentioned embodiment, the camera module can be added an aperture adjustment function. Further, in the above-mentioned embodiment, a height design of a lens holder of the physical iris diaphragm can be used to compensate for the inconsistency between a reserved height of the mobile phone and a height of the camera module, so that the camera module can be accurately aligned with the under-screen camera area. At the same time, the lens group of the same optical design can be adapted to multiple models of terminal devices with different sizes (for example, multiple models of mobile phones with different thicknesses). Further, in order to make the present application easier to understand, the following further describes the technical effect of using a reflection effect of the iris diaphragm to compensate the brightness of the under-display camera area. In order to increase the amount of light entering the camera module, the pixel density of the under-display camera area (sometimes referred to as PPI in the industry, and its full name is Pixels Per Inch) is set to be smaller than the pixel density of the non-under-display camera area. It should be noted that in the present application, a lower pixel density of the under-display camera area is set to increase the pixel pitch. Therefore, in the under-display camera area, a light-emitting surface per unit area may be reduced, which may cause the brightness of the under-display camera area decreases (referring to the lower brightness of the under-display camera area compared to the non-display camera area). If the brightness of the under-display camera area is not compensated, then in the full-screen display, although a position of the front camera module can display images, its brightness may be significantly lower, then in contrast with the surrounding non-screen camera area, this position (the position of the front camera module) may form a dark spot (that is, an area with significantly lower brightness than the surrounding areas). Such a dark spot may be easily noticed by users visually, thereby affecting user experience. Based on the above analysis, it can be seen that in the above embodiment, the brightness of the under-display camera area is compensated by the reflection effect of the iris diaphragm, which can eliminate or suppress the aforementioned dark spot caused by the increase in the pixel pitch of the under-display camera area. Further, in an embodiment of the present application, the under-display camera assembly further includes a first control unit, which is used to control both of the under-display camera area and the non-under-display camera area to display images under a non-working state of the camera module; and to control a display function of the under-display camera area to be turned off under a working state of the camera module. In the area where the display function is turned off (such as the under-display camera area), the light-emitting layer of each pixel does not emit light, so that when the module is shooting, there will be no stray light from the display screen that affects the image shooting. During shooting, all of the non-under-display camera area can display images; it is also possible not to display image in the surrounding area surrounding the under-display camera area (that is, the light-emitting layer of the pixels in the surrounding area does not emit light), and remaining part displays the image. For example, when the under-display camera assembly is applied to the smart phone, when the smart phone calls the front camera, the first control unit can turn off the display function of the under-display camera area of the screen (that is, the under-display camera area is not lighted), so that external light can pass through the under-display camera area and be received by the front camera. Since many improvements in the under-display camera area can increase its light transmittance, the amount of light entering the front camera can reach the standard for effective imaging. At the same time, the non-under-display camera area of the screen can still work in order to display a picture taken by the front camera for better taking pictures (for example, the non-under-display camera area displays a face image during a Selfie) or video shooting (For example, during a video conference, the corresponding image is displayed in the non-under-display camera area). In this embodiment, the first control unit may be configured in an operating system or an application of the mobile phone (or other terminal device), or may be implemented as a part of a display driving circuit.

Further, in an embodiment of the present application, the under-display camera assembly further includes a second control unit, which is used to compensate brightness of the under-display camera area when both of the under-display camera area and the non-under-display camera area display images. Here, the compensation for the brightness may be compensation at software level, for example, adaptive adjustment at operating system level or application level of the mobile phone (or other terminal device). For example, by the software adjustment, the brightness of the under-display camera area is increased so as to be consistent with the surrounding non-under-display camera area, thereby eliminating or suppressing dark spots in the under-display camera area. In this embodiment, software compensation of the second control unit can be complementary to hardware compensation realized by the iris diaphragm reflection, so that the user can see a complete and continuous image on the screen, thereby obtaining extremely shocking visual enjoyment. Of course, the brightness of the under-display camera area can also be compensated in the display driving circuit. It should be noted that in another embodiment of the present application, it can also achieve that with the TFT in the under-display camera area (that is, a thin film transistor switch under the light-emitting layer of each pixel), the brightness per unit area of the under-display camera area is equal to the brightness per unit area of the other areas (that is, the non-display camera area), so as to realize the brightness compensation of the under-display camera area. That is, the second control unit can be implemented at hardware level of the display screen. This compensation effect can also be complementary to hardware compensation realized by the iris diaphragm reflection, so that the user can obtain the extremely shocking visual enjoyment.

Furthermore, it should be noted that since many improvements have been made to increase the transmittance of the under-display camera area, in addition to the brightness, there may be other differences in the display effect compared with the non-under-display camera area. For example, due to many improvements to increase the transmittance of the under-display camera area, other display parameters such as contrast of the under-display camera area may change, as a result, a certain boundary may be formed between the under-display camera area and the non-under-display camera area due to this change. If this kind of boundary is easy to be noticed by a human eye, it may also make people feel that an image displayed on the screen is incomplete and discontinuous, and a visual effect of the full screen may be compromised. Based on the above analysis, in an embodiment of the present application, the under-display camera assembly may further include a second control unit, which is used to compensate the display parameters of the under-display camera area when both of the under-display camera area and the non-under-display camera area display images, so that the displayed image transits smoothly between the under-display camera area and the non-under-display camera area, so that the under-display camera area and the non-under-display camera area can form a complete and continuous picture, and there is no boundary between the non-under-display camera area and the non-under-display camera area in the picture that is easy to be noticed by the naked eye. Compensating the display parameters of the under-display camera area may be compensation at the software level, for example, adaptive adjustment at the operating system level or application level of the mobile phone (or other terminal device). Of course, the display driving circuit can also be used to compensate the display parameters of the under-display camera area. Display parameters can include brightness and contrast.

Figure 5:
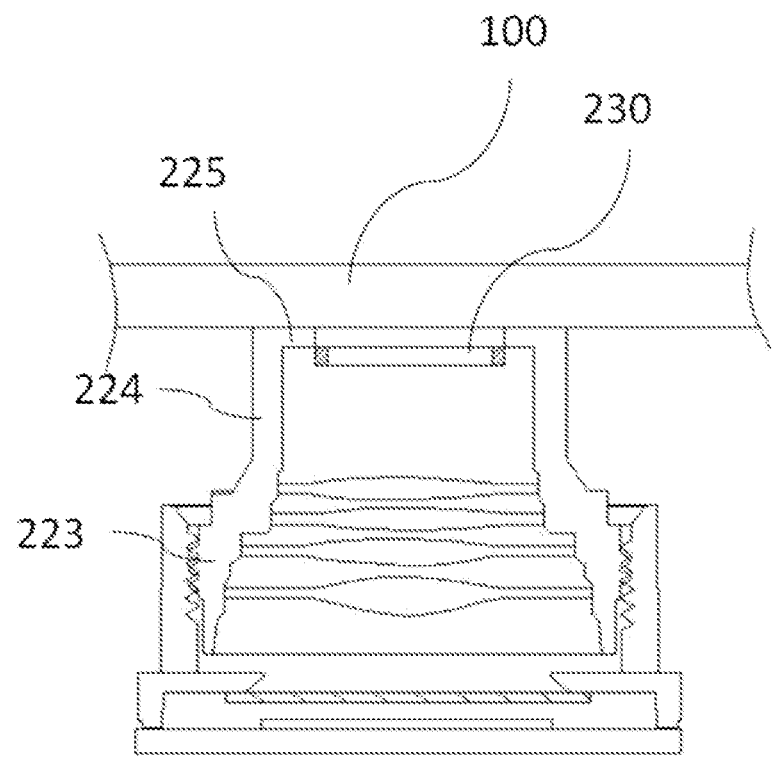
FIG. 5 shows a schematic cross-sectional view of an under-display camera assembly with an enlarged specific structure of a camera module in another embodiment of the present application.

Further, in the above-mentioned embodiment, the inconsistency between the reserved height of the mobile phone and the height of the camera module is compensated by the first lens holder of the iris diaphragm. However, it should be noted that the present application is not limited to this solution. For example, FIG. 5 shows a schematic cross-sectional view of an under-display camera assembly with an enlarged specific structure of a camera module in another embodiment of the present application. In this embodiment, the inconsistency between the reserved height of the mobile phone and the height of the camera module can be compensated by a special design of the lens barrel. In this embodiment, the lens barrel 222 includes a lens group installation section 223 and an extension section 224. Wherein, the lens group is installed on an inner side of the lens group installation section 223, the extension section 224 is formed by extending upward from a top portion of the lens group installation section 223, and a top surface of the extension section 224 bears against the bottom surface of the organic light-emitting diode display screen 100. In this embodiment, existence of the extension section 224 makes the first lens of top portion of the lens group not close to a top portion of the lens barrel, but is installed at a certain position in a middle part of the lens barrel 222. Herein, this position can be serves as a boundary point between the lens group installation section 223 and the extension section 224. In this embodiment, the iris diaphragm 230 may be installed on the extension section 224 of the lens barrel. It should be noted that in another embodiment, the iris diaphragm may also be installed on the bottom surface of the organic light-emitting diode display screen. When it is installed on the bottom surface of the organic light-emitting diode display screen, in order to avoid light leakage, there is no gap between an outer surface of the iris diaphragm and the inner surface of the extension portion, or the gap between the outer surface of the iris diaphragm and the inner sides of the extension portion is blocked by black objects. It should be noted that in this embodiment, the iris diaphragm 230 may be composed of a driving module and a blade installed on the driving module. Unlike the embodiment shown in FIG. 3, the drive module or a housing of the drive module in this embodiment does not function as a lens holder (that is, it is not used to compensate for the inconsistency between the height of the mobile phone and the height of the camera module), so it is no longer called the "first lens holder".

As mentioned above, when the camera module is applied to the under-display camera assembly, since the screen and the camera module need to be strictly aligned with the light path, they need to be assembled in a tightly matched manner. However, a distance between a main board of the mobile phone and the OLED screen is often not equal to the height of the camera module. For example, when the bottom part of the camera module is installed on the main board of the mobile phone, there may be a gap between the top of the camera module and the OLED screen, which makes it very difficult to align the camera module with a light-transmitting area of the OLED screen. Consumer electronic terminal devices on the market (such as the smart phones) are pursuing thin and light, and space inside the devices is often very compact. In a mobile phone design, it is necessary to make full use of an internal space of the device to cleverly accommodate various modules and parts of the device, which is very difficult to design. Therefore, a size of a space reserved for each module in the mobile phone is often difficult to modify at will. On the other hand, the camera module is a kind of precision optical device. Under the current development trend of light and thin, the size of the camera module is getting smaller and smaller, and requirements for imaging quality are getting higher and higher, as a result, the design and production of the camera module also face great difficulties. For example, in order to ensure the imaging quality, it is often necessary to adjust tolerances in various aspects, such as manufacturing tolerances of each lens in the camera module and the assembly tolerances brought about by the lens erection. In this case, if the design of the camera module is rashly changed in order to adapt to the size of the space reserved for the mobile phone, for example, to adjust the total optical length (TTL) of the camera module so that it matches the bottom surface of the display screen to a top surface of the main board of the mobile phone (here, the top surface can be a surface of an installation groove reserved for the main board of the mobile phone), actual production of camera module products may be inconsistent with the design due to various tolerance issues. If the various optical components of the camera module are re-calibrated, it will lead to a decrease in research and development efficiency and a significant increase in product cost. In addition, in some cases, the size of the space reserved by the mobile phone may be too different from an original design of the camera module. If the height of the camera module is forcibly adjusted to fit the size of the space reserved by the mobile phone, the camera module may not be able to satisfy conditions of the optical imaging at all.

In the above-mentioned embodiment, with the extension portion being provided on the top portion of the lens barrel to make the screen and the camera module bear against each other, the camera module can accurately align with the under-display camera area. Moreover, the lens group of the same optical design can be adapted to multiple models of terminal devices with different sizes (for example, multiple models of mobile phones with different thicknesses). In the above embodiment, modification of the optical design is avoided, and only a manufacturing mold of the lens barrel (the lens barrel is usually made based on injection molding) is modified. precision requirements and manufacturing difficulty of the lens barrel are generally lower than that of the lens (the lens is directly in the imaging optical path, even a very small tolerance may cause the imaging quality to be substandard), so the solution of the above embodiment can not only enable the camera module to accurately align with the under-display camera area, but also improve research and development efficiency of the camera module and reduce product cost.

In order to make the technical effects of the present application easier to understand, a comparative example is introduced below for comparison and description. When the size of the space reserved for the camera module of the mobile phone is inconsistent with the actual size of the camera module, a person of ordinary skill in the art may think of another solution, that is, without changing the size of the camera module, an intermediary is added between the camera module and the bottom surface of the display screen to fill the gap between the top surface of the camera module and the bottom surface of the display screen. However, due to the need to assemble more components, assembly accu-racy will be reduced, which may cause the camera module to be unable to accurately align with the under-display camera area. On the other hand, when the assembled assembly or device is damaged by a drop or collision, the intermediary is likely to fall, which affects reliability. In the above-mentioned embodiments of the present application, the lens barrel is directly molded by a molding process such as injection molding, which has high accuracy and high reliability. Further, in the above-mentioned embodiment, light reflected by the iris diaphragm is actually light emitted by the light-emitting layer of the pixel. Therefore, a brightness compensation provided by a reflective surface of the iris diaphragm can produce corresponding brightness and darkness changes according to the brightness and darkness changes of the displayed image (that is, a darker pixel position compensates less brightness value, and a brighter pixel position compensates more brightness value), thereby cleverly achieving pixel-level control. In the following, a modified embodiment in which the reflective structure of the iris diaphragm is replaced with a light-emitting structure will also be mentioned. It should be noted that this modified embodiment can also achieve effect of brightness compensation to a certain extent. However, by the iris diaphragm with the reflective structure, the effect of the brightness compensation can produce corresponding brightness and darkness changes according to the brightness and darkness changes of the displayed image, so overall display effect of the full screen can be better.

Further, in an embodiment of the present application, the height of the extension section is determined based on the total optical length of the camera module, the distance from the photosensitive surface of the camera module to the bottom installation surface of the camera module, and the distance from the bottom installation surface of the camera module to the bottom surface of the organic light-emitting diode display screen, and the height is the size in the optical axis direction. Herein, the total optical length (TTL) refers to the distance from a center of a first incident surface of the lens group to the photosensitive surface of the photosensitive chip. The photosensitive surface is the surface of the photosensitive area of the photosensitive chip. The height of the extension section can be configured such that the size of the space reserved for the camera module by the mobile phone is consistent with the actual size of the camera module. The actual size of the camera module here mainly refers to a distance from the top surface of the lens barrel of the camera module to the bottom surface of the photosensitive assembly (usually the bottom surface of the circuit board). Further, in an embodiment of the present application, the thickness of the extension section is consistent with a thickness of the top portion of the lens group installation section. Herein, the extension section and the lens group installation section are both cylindrical. The thickness here refers to a thickness in the radial direction, that is, a thickness in a direction perpendicular to the optical axis.

Further, still referring to FIG. 5, in this embodiment, the top portion of the extension section 224 has an expansion portion 225 formed by extending along the radial direction, so that a width of the top surface of the extension section 224 is greater than an average thickness of the extension section 224, wherein the radial direction is the direction perpendicular to the optical axis, and the width of the top surface is the size of the top surface in the radial direction. In this embodiment, the expansion portion 225 is formed by extending the top of the extension section inward along the radial direction, and inward direction is a direction toward the optical axis. In this embodiment, the expansion portion 225 can increase a bearing surface between the lens barrel and the display screen, thereby making the structure of the under-display camera assembly more stable. At the same time, in this embodiment, the extension section 224 first extends upward and then bends and extends horizontally, which can prevent part of the incident light from being blocked by the extension section. For the under-screen camera module, incident light from outside needs to pass through the display screen, and the solution of this embodiment can ensure that the incident light passing through the display screen is not wasted, thereby ensuring the maximum amount of light entering the camera module. Conversely, if simply increase a thickness of the horizontal expansion portion at the top of the lens barrel (here the thickness is the size in the optical axis direction, that is, an axial thickness), part of the incident light will be blocked by the horizontal expansion portion, resulting in the amount of light entering the camera module insufficient. Moreover, in this embodiment, a shape of the lens barrel with the extension section is basically the same as a shape of a traditional lens barrel, which helps to control manufacturing tolerances, thereby ensuring that the camera module and the display screen can be accurately aligned and assembled in actual production. In this embodiment, the iris diaphragm 230 is installed on the expansion portion 225.

Figure 6:
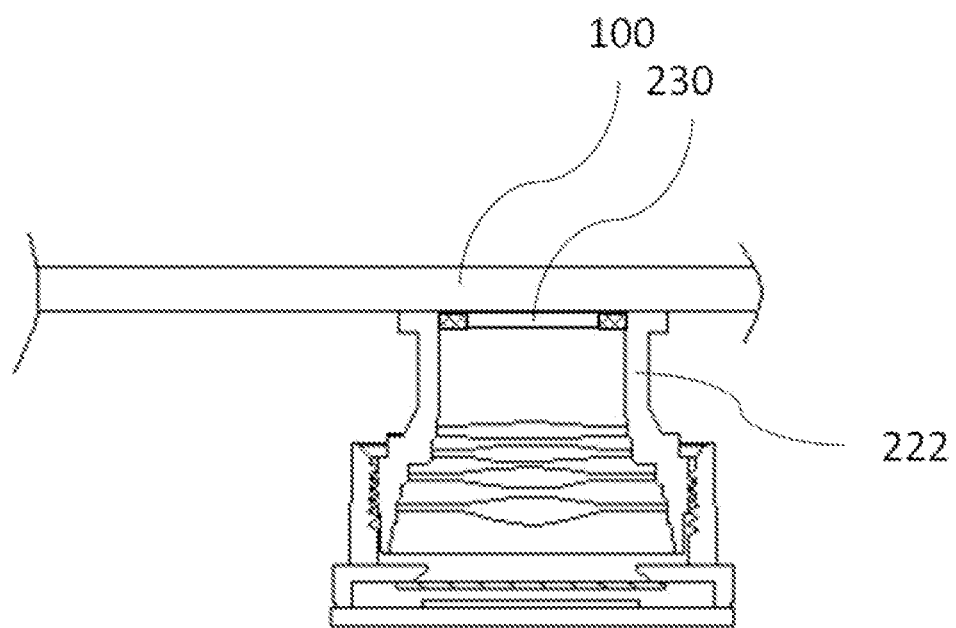
FIG. 6 shows a schematic cross-sectional view of an under-display camera assembly according to a modified embodiment of the present application.
Figure 7:
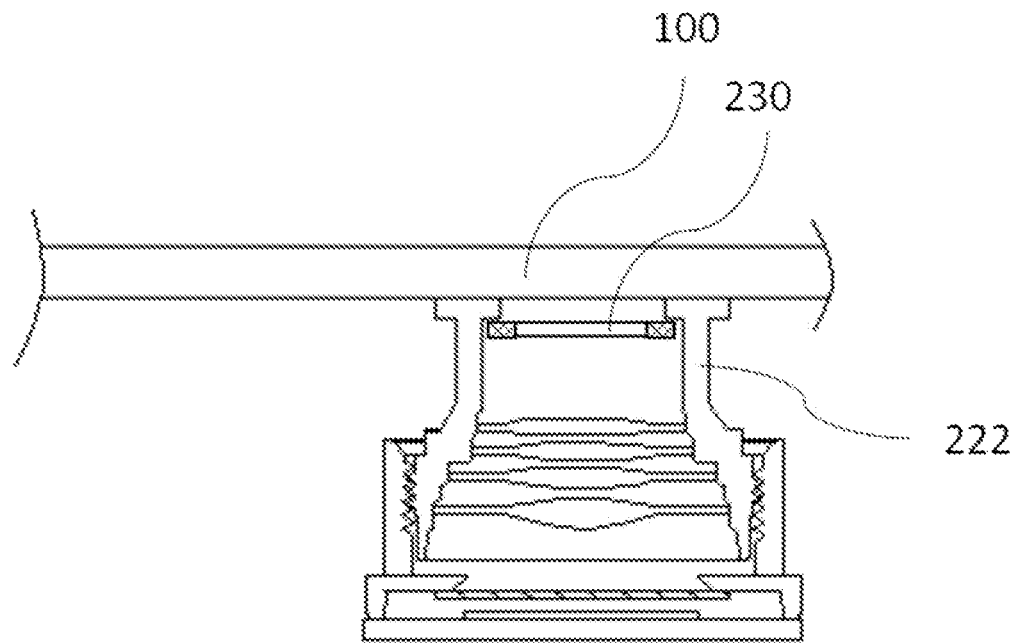
FIG. 7 shows a schematic cross-sectional view of an under-display camera assembly according to another modified embodiment of the present application.
Figure 8:
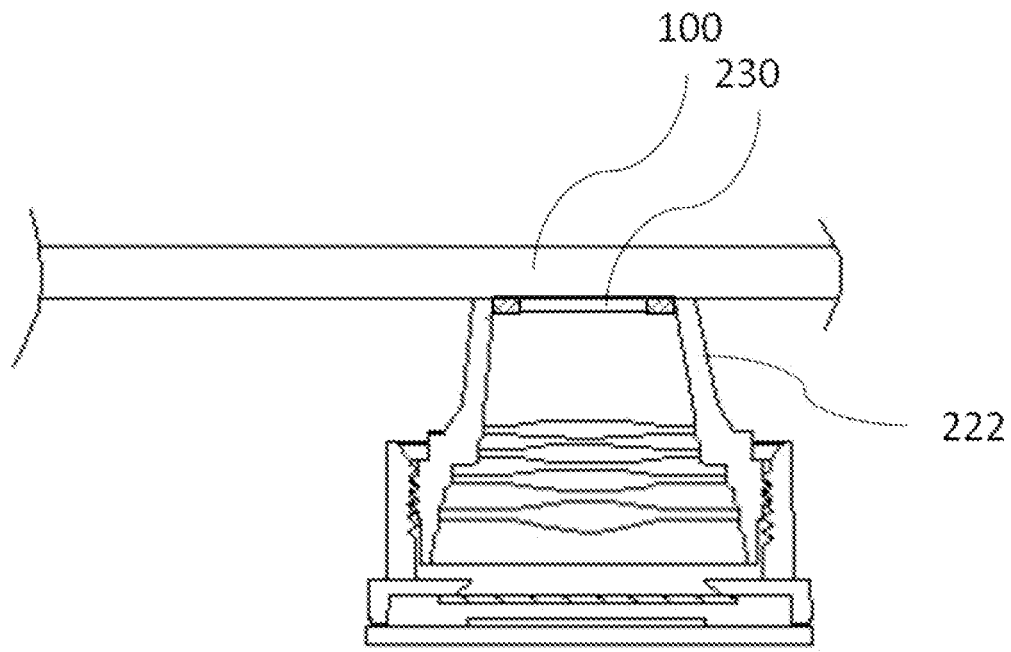
FIG. 8 shows a schematic cross-sectional view of an under-display camera assembly according to still another modified embodiment of the present application.
Figure 9:
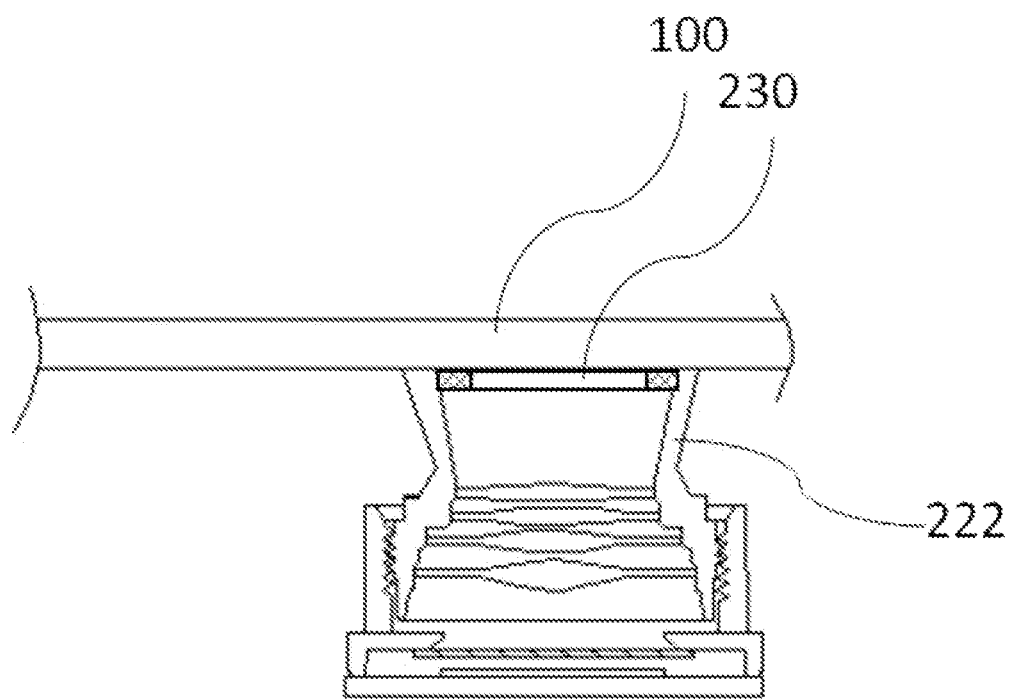
FIG. 9 shows a schematic cross-sectional view of an under-display camera assembly according to yet another modified embodiment of the present application.
Figure 10:
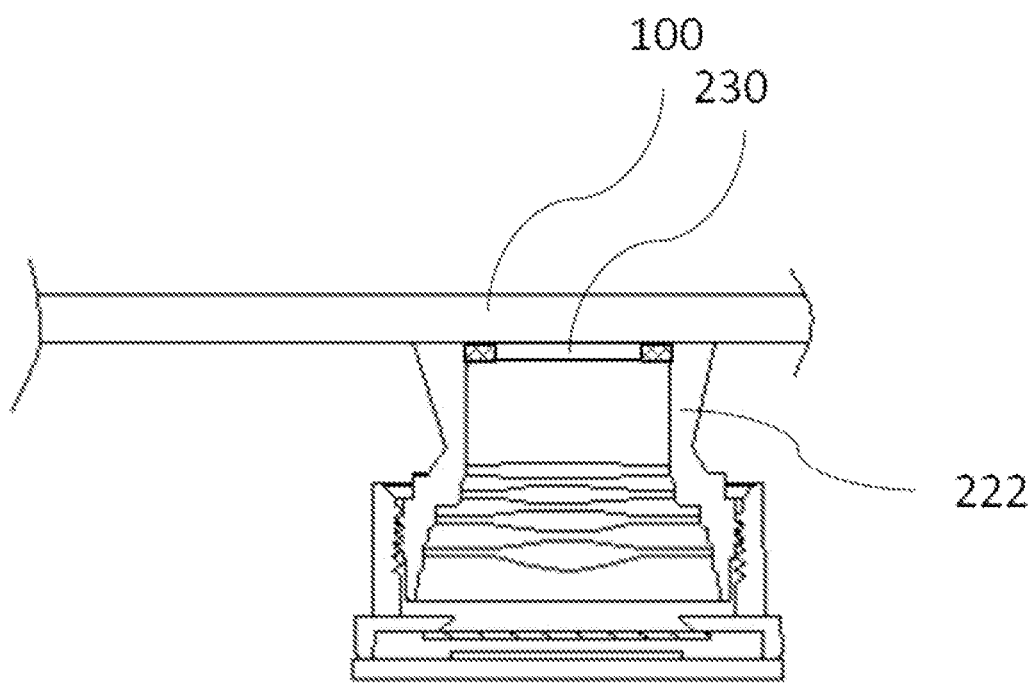
FIG. 10 shows a schematic cross-sectional view of an under-display camera assembly according to yet another modified embodiment of the present application.

It should be noted that the shape of the lens barrel provided by the embodiment shown in FIG. 5 is not unique. In other embodiments of the present application, other modified shapes of the lens barrel may also be provided. For example, FIG. 6 shows a schematic cross-sectional view of the under-display camera assembly of a modified embodiment of the present application. The difference between this embodiment and the embodiment in FIG. 5 is that the expansion portion of the extension section of the lens barrel 222 in this modified embodiment is formed by the top portion of the extension section extending outward along the radial direction. FIG. 7 shows a schematic cross-sectional view of an under-display camera assembly of another modified embodiment of the present application. The difference between this embodiment and the embodiment in FIG. 5 is that the expansion portion of the extension section of the lens barrel 222 in this modified embodiment is formed by the top portion of the extension section extending inward and outward at the same time along the radial direction. FIG. 8 shows a schematic cross-sectional view of an under-display camera assembly of still another modified embodiment of the present application. In this modified embodiment, an aperture of a light through hole of the extension section of the lens barrel 222 is gradually reduced, and an aperture of the light through hole of the extension section close to one end of the lens group installation section is larger than an aperture of the light through hole of the extension section close to the end of the display screen. FIG. 9 shows a schematic cross-sectional view of an under-display camera assembly of yet another modified embodiment of the present application. In this modified embodiment, the aperture of the light through hole of the extension section of the lens barrel 222 is gradually increased, and the aperture of the light through hole of the extension section close to one end of the group installation section is smaller than the aperture of the light through hole of the extension section close to one end of the display screen. FIG. 10 shows a schematic cross-sectional view of an under-display camera assembly of yet another modified embodiment of the present application. In this modified embodiment, a thickness of the extension section of the lens barrel 222 is gradually increased, wherein a thickness of the extension section close to one end of the group installation section is smaller than a thickness of the extension section close to one end of the display screen, and the aperture of the light through hole of the extension section (that is, the inner diameter of the extension section) can be kept consistent. In this modified embodiment, since a thickness of the top portion of the extension section is increased, the bearing surface between the lens barrel and the display screen can be increased, thereby making the structure of the under-display camera assembly more stable.

Further, in an embodiment of the present application, the lens group installation section and the extension section are made based on an integral molding manufacturing process. The integral molding manufacturing process may be integral molding based on an injection molding process. Further, in an embodiment of the present application, the lens barrel may be made of a light-shielding material to form a so-called "black object".

Further, in an embodiment of the present application, the top surface of the extension section and the bottom surface of the organic light-emitting diode display screen are fixed together by adhering.

Further, in an embodiment of the present application, the bottom portion of the organic light-emitting diode display screen has a back plate, and the back plate can play a role of protection and support. The bottom surface of the organic light-emitting diode display screen may be a bottom surface of the back plate. In another embodiment of the present application, the position of the back plate corresponding to the under-display camera area may be removed, so as to increase the light transmittance of the under-display camera area. At this time, the bottom surface of the organic light-emitting diode display screen may be a bottom surface of the organic light-emitting diode display screen exposed after the back plate is removed. In other words, when a position of the back plate corresponding to the under-display camera area is removed, a groove is formed on the bottom surface of the organic light-emitting diode display screen, and the extension section of the camera module can extend into the groove. And the top surface of the extension section can bear against a bottom surface of the groove. Further, in an embodiment, on the basis that the top surface of the extension section bears against the bottom surface of the groove, an outer side surface of the extension section may also bear against a side wall of the groove, thereby making a structure of the under-screen camera assembly more stable.

Further, in an embodiment of the present application, the iris diaphragm is a physical diaphragm provided between the display screen and the camera module. Wherein, the physical diaphragm may be a device with a reflection/transmission switching function. Specifically, the physical diaphragm may be a variable aperture with a reflective structure provided on the outer surface (that is, the upper surface) (which may be realized by coating a reflective layer on an outer surface of the aperture or using a reflective material). When the camera module is not shooting, the aperture can be in a closed state, that is, blades of the physical diaphragm are closed. At this time, the aperture does not provide a through hole for light to pass, and a reflection structure on the surface of the aperture reflects light from the light-emitting layer of the display pixel, which provides sufficient brightness for the under-display camera area for full display of the screen. When the camera module is shooting, the aperture is switched to open to become a required light through aperture, which can allow sufficient light to pass through and meet imaging requirements of the under-screen camera module.

In an embodiment of the present application, the iris diaphragm may be installed on an inner side surface of the extension section of the lens barrel. In another embodiment, the iris diaphragm may be installed on the bottom surface of the organic light-emitting diode display screen. Moreover, in this embodiment, there is no gap between the outer side surface of the iris diaphragm and the inner side surface of the extension portion, or the gap between the outer side surface of the iris diaphragm and the inner side surface of the extension portion is blocked by the black object.

Figure 11A:
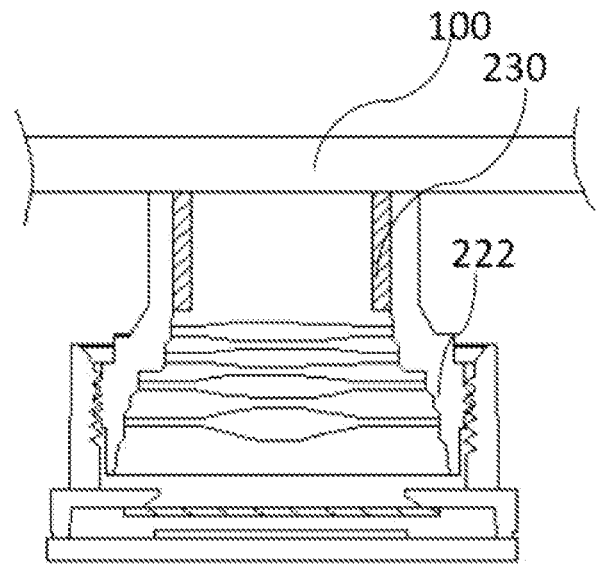
FIG. 11A shows a schematic cross-sectional view of an under-display camera assembly with a MEMS micro-mirror in an open state in an embodiment of the present application.
Figure 11B:
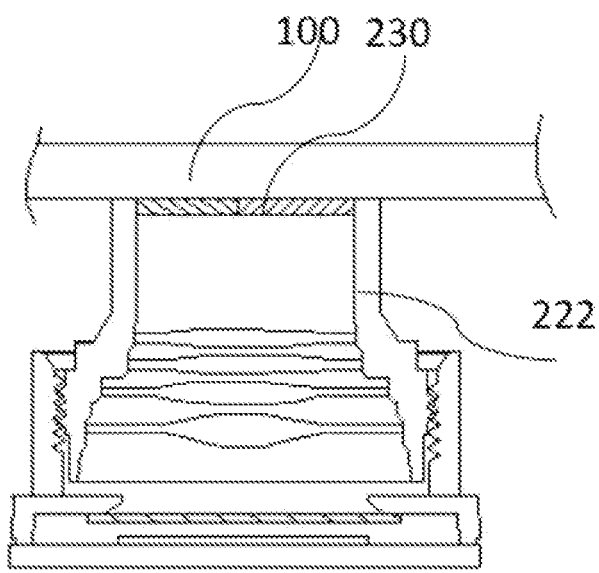
FIG. 11B shows a schematic cross-sectional view of an under-display camera assembly with a MEMS micro-mirror in a close state in an embodiment of the present application.
Figure 11C:
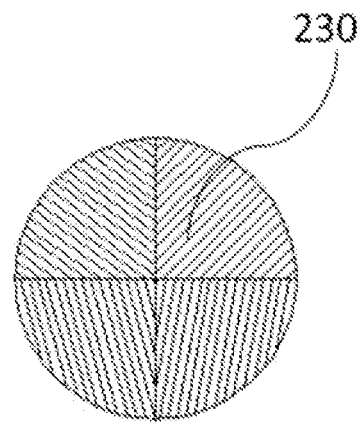
FIG. 11C shows a schematic top view of a first design solution of the MEMS micro-mirror in the close state in an embodiment of the present application.
Figure 11D:
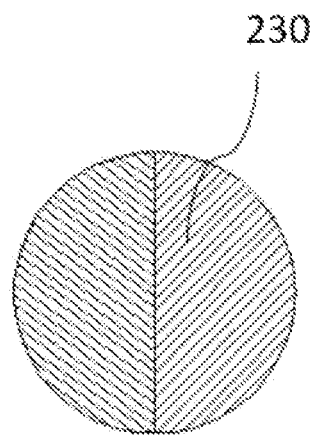
FIG. 11D shows a schematic top view of a second design solution of the MEMS micro-mirror in the close state in an embodiment of the present application.
Figure 11E:
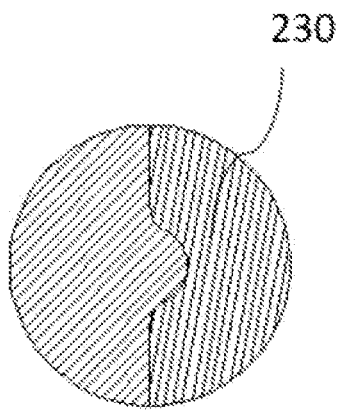
FIG. 11E shows a schematic top view of a third design solution of the MEMS micro-mirror in the close state in an embodiment of the present application.

In other modified embodiments of the present application, the iris diaphragm may be composed of MEMS micro-mirrors, which can reflect light, and under an action of electrostatic force, the MEMS micro-mirrors can have two states: open state and close state. When in the open state, light can pass through the MEMS micro-mirror to reach the camera module for imaging. When in the close state, the camera module does not shoot, and the MEMS mirror can reflect light, so as to provide sufficient brightness for the screen display in the under-display camera area. The MEMS mirror may be composed of a single element, or may be composed of multiple elements. FIG. 11A shows a schematic cross-sectional view of an under-display camera assembly in an open state of the MEMS micro-mirror in an embodiment of the present application. FIG. 11B shows a schematic cross-sectional view of an under-display camera assembly in a close state of the MEMS micro-mirror in an embodiment of the present application. FIG. 11C shows a schematic top view of a first design solution in a close state of the MEMS micro-mirror in an embodiment of the present application. Under this design solution, the iris diaphragm includes four MEMS mirror elements. FIG. 11D shows a schematic top view of a second design solution in a close state of the MEMS micro-mirror in an embodiment of the present application. Under this design solution, the iris diaphragm includes two MEMS mirror elements. FIG. 11E shows a schematic top view of a third design solution in a close state of the MEMS micro-mirror in an embodiment of the present application. This design solution is a modification of the solution shown in FIG. 11D. In the solution shown in FIG. 11E, contact surfaces of the two MEMS mirror elements have mutually adapted protrusions or grooves.

In another modified embodiment of the present application, the iris diaphragm may be a highly elastic reflective film, and the elastic film may be doped with a reflective material or coated with a reflective layer, and when the highly elastic reflective film is stretched, the light transmittance of the highly elastic reflective film increases, and the reflectivity decreases, when the highly elastic reflective film recovers (refers to the recovery from the stretched state), the reflectivity of the highly elastic reflective film increases, and the light transmittance decreases. Therefore, when the camera module needs to shoot, the drive device of the highly elastic reflective film can be activated. Under the action of the drive device, the highly elastic reflective film is stretched. The light transmittance is increased, so that the light can fully pass through the highly elastic reflective film and reach the imaging module. When the module part needs to shoot, the driving device of the highly elastic reflective film can be turned off, the highly elastic reflective film returns to its natural state, the light transmittance of the highly elastic reflective film decreases, and the reflectivity increases, thereby providing sufficient brightness for the display of the display screen. The driving device may be a device using piezoelectric, memory metal, or VCM structure (also referred as voice coil motor structure or voice coil electronic machine structure). The highly elastic reflective film may be provided on the display screen or the module. When the highly elastic reflective film is provided on the camera module, the driving device may be a motor of the camera module.

In another modified embodiment of the present application, the reflective film or the reflective structure of the iris diaphragm can be replaced by a light-emitting element or a light-emitting structure on the outer surface of the iris diaphragm. In this modified embodiment, a luminous flux of the imaging area can be controlled by changing the opening and closing of the through hole of the iris diaphragm, and the brightness value of the display screen of the under-display camera area is increased when the through hole is closed, so as to compensate for the decrease in display brightness caused by the reduction of pixel density in the camera area (i.e., the under-display camera area) or the reduction of pixel size.

Further, in an embodiment of the present application, the iris diaphragm may be integrated in the organic light-emitting diode display screen. For example, the iris diaphragm can be fabricated between the pixel light-emitting layer and the TFT layer of the organic light-emitting diode display screen (the TFT layer is usually fabricated as a TFT unit for controlling the light emission and brightness of each pixel). Or, the iris diaphragm may be fabricated on the TFT layer (the TFT layer may also be understood as the driving circuit layer of the pixel). In other words, it is only required that the iris diaphragm is provided between the bottom surface of the pixel light-emitting layer and the top surface of the frontmost lens of the lens group. Wherein, the iris diaphragm has a closed state and a transmission state, and can be switched between the two in a controlled manner. The closed state is a state in which the iris diaphragm closes the optical path of the camera module, and in the closed state, the iris diaphragm reflects the light from the organic light-emitting diode display screen or the iris diaphragm itself emits light and the emitted light exits from the front of the organic light-emitting diode display screen. The transmission state is a state in which the iris diaphragm opens the optical path of the camera module.

Further, in an embodiment of the present application, a pixel size of the under-display camera area is the same as a pixel size of the non-under-display camera area. The pixel size here refers to a size of the light-emitting structure. Under this design, the under-display camera area and the non-under-display camera area can share many production processes and production device, which helps to improve production efficiency and increase yield. It should be noted that in other embodiments of the present application, the pixel size of the under-display camera area and the pixel size of the non-under-display camera area may also be different. Reducing the pixel density of the under-display camera area can help increase the spacing between pixels, thereby increasing the transmittance of the under-display camera area.

Further, in an embodiment of the present application, a terminal device is also provided, which includes the under-display camera assembly described in any of the foregoing embodiments. Wherein, the camera module may be used as a front camera module of the terminal device, and the organic light-emitting diode display screen may be used as a display panel on the front of the terminal device.

Pixel density (PPI) herein is sometimes referred as display density.

In the under-display camera assembly of the above embodiment, the iris diaphragm is provided on the top of the camera module, but it should be noted that the application is not limited to this. For example, in other embodiments of the present application, the pixel density of the under-display camera area 120 may be set to be smaller than the pixel density of the non-under-display camera area 110, so as to increase the light transmittance of the under-display camera area 120, so that the under-display camera area and the under-display non-camera area can jointly form a complete picture, and then truly realize the full-screen display effect (that is, the full-screen is realized by reducing the PPI of the under-display camera area). In these embodiments, the camera module may not be provided with the iris diaphragm.

Specifically, still referring to FIG. 1, the under-display camera assembly includes an organic light-emitting diode display screen 100 (i.e., an OLED screen) and the camera module 200 located at the rear end of the organic light-emitting diode display screen 100. The optical axis ax of the camera module 200 is substantially perpendicular to the surface 101 of the organic light-emitting diode display screen 100. Here, the "rear end" refers to the end of the imaging optical path of the camera module 200 close to the image side. The camera module 200 is located at the rear end of the under-display camera area 120 of the organic light-emitting diode display screen 100. Wherein, the under-display camera area 120 is the area in the organic light-emitting diode display screen 100 that is adapted to the camera module 200. Further, still referring to FIG. 2, the display area of the organic light-emitting diode display screen includes the under-display camera area 120 and the non-under-display camera area 110. The under-display camera area 120 may be circular, and its size may be adapted to the size of the camera module 200. The under-display camera area 120 may be surrounded by the non-under-display camera area 110. In this embodiment, the pixel density of the under-display camera area 120 (sometimes referred to as PPI in the industry, and its full name is Pixels Per Inch) is set to be smaller than the pixel density of the non-under-display imaging area 110, so as to improve the light transmittance of the under-display camera area 120. In this way, it is possible that the screen can avoid the imaging light path of the camera module without punching holes to maintain the integrity of the display screen. Moreover, since the light-emitting structure and the corresponding microcircuit can be retained, when the camera module is not used, the under-display camera area 120 can perform image display. The under-display camera area 120 and the non-under-display camera area 110 can jointly form a complete picture, truly realizing a full-screen display effect. The under-display camera assembly of this embodiment is particularly suitable for use in the smart phone, and the camera module in the under-display camera assembly is particularly suitable for use as the front camera module of the smart phone.

Figure 12:
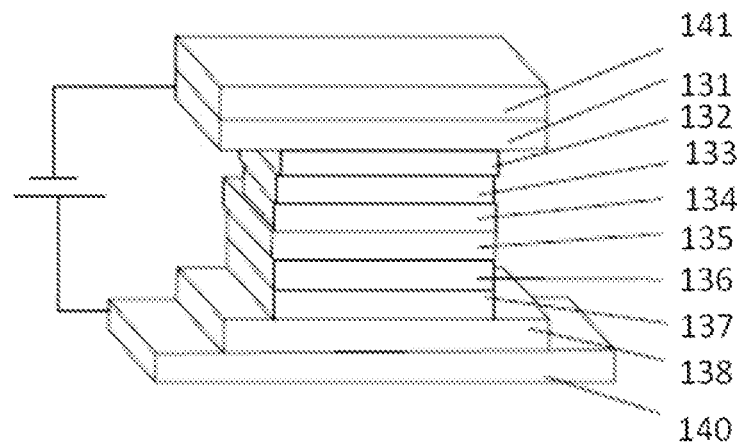
FIG. 12 shows a schematic diagram of a circuit structure of a single pixel in an embodiment of the present application.

Further, in an embodiment of the present application that realizes the full screen by reducing the PPI of the under-display camera area, the pixel pitch of the under-display camera area 120 is set to be greater than the pixel pitch of the non-under-display camera area 110, wherein the pixel pitch is the pitch between the light-emitting structures of adjacent pixels of the organic light-emitting diode display screen 100. In order to better understand the essence of this embodiment, the specific structure of the organic light-emitting diode display screen will be described below in conjunction with the accompanying drawings (note that these specific structures can also be applied to the embodiments described above in which the extension portion is provided on the top portion of the lens barrel). FIG. 12 shows a schematic diagram of a circuit structure of a single pixel in an embodiment of the present application. Referring to FIG. 12, in this embodiment, the organic light-emitting diode display screen 100 includes, from the rear end to the front end (from top to bottom in FIG. 12), sequentially: a cathode layer 131, an electron injection layer 132, an electron transport layer 133, a light emitting layer 134, and a hole transport layer 135, a hole injection layer 136, a buffer layer 137, and an anode 138. In this embodiment, the organic light-emitting diode display screen 100 emits light from a side of the anode 138. Therefore, the anode 138 is located at the front end and the cathode layer 131 is located at the rear end. Here, the front end refers to the end of the imaging optical path of the camera module close to the object, and the rear end refers to the end of the imaging optical path of the camera module close to the image. When making the organic light-emitting diode display screen 100, the anode 138, the buffer layer 137, the hole injection layer 136, the hole transport layer 135, the light-emitting layer 134, the electron transport layer 133, the electron injection layer 132 and the cathode layer 131 can be made sequentially on a substrate 140. An upper surface of the cathode layer 131 can be further fabricated with a cover plate 141. It should be noted that in other embodiments of the present application, the organic light-emitting diode display screen 100 may emit light from a side of the cathode layer 131, at this time, the cathode layer 131 is located at the front end, and the anode 138 is located at the rear end. In this embodiment, the non-under-display camera area 110 and the under-display camera area 120 may both have the above structures, but a microstructure inside the under-display camera area 120 can be specially designed to increase the light transmittance. In the under-display camera area 120 of this embodiment, for a single pixel, the light-emitting layer 134 can be made in a groove. For example, when a lower layer structure of the light-emitting layer 134 is made, the lower layer structure can be made into the groove. The light-emitting layer 134 is formed at a bottom portion of the groove, and a depth of the groove is greater than a height of the light-emitting layer 134. And a side wall of the groove may be inclined and a side wall of a pixel isolation layer may be formed on the basis of the side wall of the groove. Wherein, for a display screen that emits light from the anode, the lower layer structure of the light-emitting layer 134 may be the electron transport layer 133, and for a display screen that emits light from the cathode, the lower layer structure of the light-emitting layer 134 may be the hole transport layer 135. Further, for the entire screen, the light-emitting layer 134 may be separated by the buffer layer 137 to form a plurality of the pixels. The buffer layer 137 may be insulating. The buffer layer 137 can prevent holes from being transported to the organic/metal cathode interface to cause quenching of light. Compared with the light-emitting structure, the buffer layer 137 has a higher light transmittance. The gap between pixels is mainly composed of the cathode layer 131 and the buffer layer 137. In this embodiment, the pixel pitch of the under-display camera area 120 is increased (for example, the pixel pitch of the under-display camera area is set to be greater than the pixel pitch of the non-under-display camera area), so that more light can pass through the gap between the pixels (mainly composed of the cathode layer 131, the buffer layer 137 and the anode 138 with larger light transmittance), thereby increasing the light input of the camera module located at the rear end of the under-display camera area, so that the camera module can shoot images through the organic light-emitting diode display screen. It should be noted that although in the above embodiment, the gap between pixels includes the cathode layer 131 and the buffer layer 137, the present application is not limited thereto. For example, in another embodiment of the present application, the gap between pixels may only include the buffer layer 137, may also include the cathode layer 131, the buffer layer 137 and the anode 138 (sometimes may also be referred to as an anode layer). But no matter what, the light transmittance of the gap between the pixels (referring to the overall light transmittance of the screen from the top surface to the bottom surface) is greater than the light transmittance of the pixel light-emitting structure position (referring to the overall light transmittance of the screen from the top surface to the bottom surface).

Further, in an embodiment of the present application that realizes the full screen by reducing the PPI of the under-display camera area, in the under-display camera area, a position of the cathode layer corresponding to the gap between the pixels has a light through groove. Wherein, the gap between pixels can be understood as the gap between the light-emitting structures of adjacent pixels. In this embodiment, the cathode layer has a design of the light through groove, which can further increase the light transmittance of the gap between the light-emitting structures of adjacent pixels. Specifically, a material of the cathode layer of the organic light-emitting diode display screen is generally an alloy with more active properties (low work function, easy to release electrons), and its light transmittance is relatively low. It is difficult to improve the transmittance by changing the cathode material. Thinning it can increase a certain transmittance, but a too thin cathode will affect the performance and yield of the organic light-emitting diode display. In this embodiment, a light through groove is provided in the cathode layer corresponding to a position of a gap of a pixel dot to increase the transmittance, which can increase the transmittance of the under-display camera area while ensuring performance and yield. The solution of this embodiment can be applied in combination with those embodiments in which the iris diaphragm is provided on the top of the camera module described above.

Further, in an embodiment of the present application for realizing the full screen by reducing the PPI of the under-display camera area, the organic light-emitting diode display screen further includes a back plate film, and in the under-display camera area, a position of the back plate film corresponding to the gap between the pixels has a light through groove. Wherein, the gap between pixels can be understood as the gap between the light-emitting structures of adjacent pixels. In this embodiment, the back plate film has a design of the light through groove, which can further increase the light transmittance of the gap between the light-emitting structures of adjacent pixels. The solution of this embodiment can be applied in combination with those embodiments in which the iris diaphragm is provided on the top of the camera module described above.

Further, in an embodiment of the present application that realizes the full screen by reducing the PPI of the under-display camera area, in the under-display camera area, the anode is made based on a nanowire process (refer to patent document CN201510069596.5), and the anode is attached to the buffer layer. In the prior art, the anode of the organic light-emitting diode display screen is usually ITO conductive glass. It is made by coating a layer of indium tin oxide (commonly known as ITO) film by sputtering, evaporation and other methods to conduct circuit conduction. In order to increase the light transmittance, a nano conductive structure such as a silver nanowire can be used instead of the ITO to increase the transmittance. The silver nanowire is a nano-scale conductive wire that can be used to make an ultra-small circuit. In addition to excellent electrical conductivity, it also has excellent light transmittance due to the nano-level size effect. For example, at 10 nm, a haze degree of the nanowire is only 0.2% (the greater the haze degree is, the lower the gloss and transparency of the film is), and the nanowires are also resistant to flexure, which is more suitable for high light transmittance and flexible organic light-emitting diode display screen. The solution of this embodiment can be applied in combination with those embodiments in which the iris diaphragm is provided on the top of the camera module described above.

Figure 13:
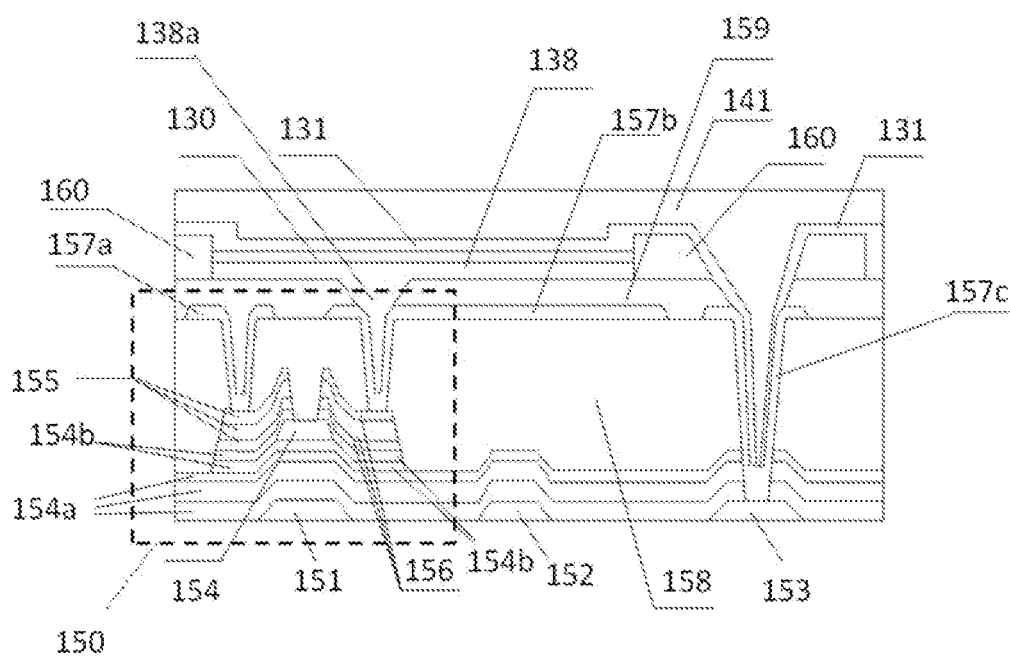
FIG. 13 shows a schematic cross-sectional view of an under-display camera area of an organic light-emitting diode display screen including a TFT layer in an embodiment of the present application.

Further, FIG. 13 shows a schematic cross-sectional view of an under-display camera area of an organic light-emitting diode display screen including a TFT layer in an embodiment of the present application. Referring to FIG. 13, in the present application, the organic light-emitting diode display screen further includes the TFT layer (TFT is called Thin Film Transistor in full, and may be called a thin film transistor). In the under-display camera area, the TFT layer includes a TFT switch unit 150, a storage capacitor 152, and a contact 153 (sometimes referred as an auxiliary electrode or a contact area). Moreover, each TFT switch unit 150 may correspond to a pixel (or it may be understood that each TFT switch unit 150 corresponds to a light-emitting structure 130, and the TFT switch unit 150 may be regarded as a control structure of the corresponding pixel). The TFT switch unit 150 may be located directly below the corresponding light-emitting structure 130. In other words, the TFT switch unit 150 may overlap or partially overlap with its corresponding light-emitting structure 130 in a top view. And the contact 153 corresponding to the TFT switch unit 150 is provided at the position of the gap between adjacent pixels. In other words, the contacts are provided directly below the gap between adjacent light-emitting structures. In the TFT layer, the contact 153 is usually used to realize electrical connection with the light-emitting structure on the upper layer or the conductive layer on the upper surface of the TFT unit. Therefore, a structure above the contact is usually simple. For example, a groove (or referred as a via) can be formed above the contact, the groove is used to attach a conductive nanowire 157c and/or a cathode 131 of the light-emitting structure 130 (based on the groove, the cathode 131 can be conducted to the contact 153 through the conductive nanowire 157c, or the cathode 131 directly contacts the contact 153 to conduct the two). The groove can be filled with the material of the cover plate 141. Since the cover plate 141 can be formed of a material with high light transmittance, the contact 153 and the area corresponding to the groove above it have good light transmittance. Providing the contact 153 in the gap between adjacent pixels can prevent the incident light passing through the pixel gap from being blocked more, thereby increasing the overall light transmittance of the screen and increasing the amount of light entering the camera module. Further, still referring to FIG. 13, in this embodiment, the TFT switch unit 150 includes a gate 151, a source 155, and a drain 156, wherein the gate 151 has a buffer layer 154a and a trench 154b. The buffer layer 154a can also cover the storage capacitor 152. In this embodiment, the drain 156 and the source 155 are both located on an upper surface of the trench 154b. The drain 156 can be located on the right side and the source 155 can be located on the left side. The gap between the two can be filled by a second buffer layer 158. The material of a third buffer layer 154 may be consistent with the second buffer layer 158. It should be noted that when the gate 151 is applied with a turn-on signal, the trench 154b can be turned on, and when the gate 151 is not applied with the turn-on signal, the trench 154*b* is insulated. Both the drain 156 and the source 155 can be composed of a multilayer structure, but these specific details can be completely consistent with the prior art, and these specific details have nothing to do with the subject matter of the present application, and therefore will not be repeated here. In this embodiment, a conductive layer may be provided on the top of the TFT switch unit 150 to facilitate electrical connection between the TFT switch unit 150 and the light-emitting structure 130. The conductive layer on the top of the TFT switch unit 150 may be an ITO layer. In a preferred embodiment, the conductive nanowire can be used to replace the ITO layer to further improve the light transmittance. Specifically, the top surfaces of the drain 156 and the source 155 are connected to the nanowires 157*a* and 157*b*, and the drain 156 and the source 155 are separated from the light-emitting structure 130 above by a third buffer layer 159. The anode 138 of the light-emitting structure 130 may communicate with the nanowire 157*b* through the via 138*a*, and then communicate with the source 155. It should be noted that the specific internal structure of the light-emitting structure 130 is not shown in FIG. 13. In this embodiment, the light-emitting structure 130 may include the hole injection layer 136, the hole transport layer 135, the light-emitting layer 134, the electron transport layer 133, and electrons injection layer 132 (refer to FIG. 12). In addition, the light-emitting structure may further include the buffer layer 137 between the anode 138 and the hole injection layer 136 (refer to FIG. 12). In this embodiment, the light-emitting structures 130 of adjacent pixels may be separated by a pixel defining layer 160. The pixel defining layer 160 can be made of organic materials with better light transmittance. The top of the light-emitting structure 130 may also be covered with an insulating layer to form the cover plate 141. In this embodiment, the light transmittance of incident light from the outside can be improved by the design of the contact position of the TFT layer. The solution of this embodiment can be applied in combination with those embodiments in which the iris diaphragm is provided on the top of the camera module described above.

Further, in an embodiment of the present application in which the full screen is realized by reducing the PPI of the under-display camera area, the under-screen camera assembly further includes a first control unit, which is used to control both of the under-display camera area and the non-under-display camera area to display images under the non-working state of the camera module; and control a display function of the under-display camera area to be turned off in the working state of the camera module. In the area where the display function is turned off (such as the under-display camera area), the light-emitting layer of each pixel does not emit light, so that when the module is shooting, there will be no stray light from the display screen that affects the image capture. During shooting, all of the non-under-display camera area can display images; it is also possible not to display image in the surrounding area surrounding the under-display camera area (that is, the light-emitting layer of the pixels in the surrounding area does not emit light), and the remaining part displays the image. For details, please refer to the description of the first control unit in the corresponding embodiment above, which will not be repeated here.

Further, in an embodiment of the present application that realizes the full screen by reducing the PPI of the under-display camera area, the under-display camera assembly further includes a second control unit, which is used to compensate the brightness of the under-display camera area when both of the under-display camera area and the non-under-display camera area display images. For details, please refer to the description of the second control unit in the corresponding embodiment above, which will not be repeated here.

Further, in another embodiment of the present application, the under-display camera assembly further includes a second control unit, which is used to compensate the display parameters of the under-display camera area when both of the under-screen camera area and the non-under-screen camera area display images, so that the displayed image transits smoothly between the under-display camera area and the non-under-display camera area, so that the under-display camera area and the non-under-display camera area can form a complete and continuous picture, and there is no boundary between the under-display camera area and the non-under-display camera area in the picture that is easy to be noticed by the naked eye. Compensating the display parameters of the under-display camera area may be compensation at the software level, for example, adaptive adjustment at the operating system level or application level of the mobile phone (or other terminal device). Of course, the display driving circuit can also be used to compensate the display parameters of the under-display camera area. Display parameters can include brightness and contrast.

Further, in an embodiment of the present application for realizing the full screen by reducing the PPI of the under-display camera area, the pixel size of the under-display camera area is the same as the pixel size of the non-under-display camera area. The pixel size here refers to the size of the light-emitting structure. Under this design, the under-display camera area and the non-under-display camera area can share many production processes and production equipment, which helps to improve production efficiency and increase yield. It should be noted that in other embodiments of the present application, the pixel size of the under-display camera area and the pixel size of the non-under-display camera area may also be different. Reducing the pixel density of the under-display camera area can help increase the spacing between pixels, thereby increasing the transmittance of the under-display camera area.

Further, in an embodiment of the present application in which the full screen is realized by reducing the PPI of the under-display camera area, a terminal device is also provided, which includes the under-display camera assembly described in any of the preceding embodiments. The camera module may be used as the front camera module of the terminal device, and the organic light-emitting diode display screen may be used as the display panel on the front of the terminal device.

The above description is only a preferred embodiment of the present application and an explanation of the applied technical principles. Those skilled in the art should understand that the scope of the invention involved in the present application is not limited to the technical solution formed by the specific combination of the above technical features, and should also cover other technical solutions formed by any combination of the above technical features or its equivalent features without departing from the inventive concept, for example, a technical solution formed by mutually replacing the above-mentioned features and the technical features disclosed in the present application (but not limited to) with similar functions.

The invention claimed is:

1. An under-display camera assembly, characterized by comprising:

an organic light-emitting diode display screen, a display area of which includes an under-display camera area and a non-under-display camera area, wherein a pixel density of the under-display camera area is set to be smaller than a pixel density of the non-under-display camera area; and a camera module, an optical axis of which is perpendicular to a surface of the organic light-emitting diode display screen, and the camera module being located at a rear end of the under-display camera area, and the camera module including an iris diaphragm, a lens group and a photosensitive assembly, wherein the organic light-emitting diode display screen includes a pixel light-emitting layer, and the iris diaphragm is provided between a bottom surface of the pixel light-emitting layer and a top surface of a foremost lens of the lens group, and the iris diaphragm has a closed state and a transmission state, and the iris is controllably switched between the closed state and a transmission state, and the closed state is a state in which the iris diaphragm closes an optical path of the camera module, and in the closed state, the iris diaphragm reflects light from the organic light-emitting diode display screen or the iris diaphragm itself emits light and the emitted light is emitted from the front of the organic light-emitting diode display screen, and the transmission state is a state in which the iris diaphragm opens the light path of the camera module.

2. The under-display camera assembly according to claim 1, wherein, the closed state is a reflective state, and the under-display camera assembly further includes a switching control unit, which is used to control the iris diaphragm to switch to the transmission state under the working state of the camera module, and to control the iris diaphragm to switch to the reflection state under the non-working state of the camera module.

3. The under-display camera assembly according to claim 2, wherein, the camera module further includes a lens barrel, and the lens group is installed on an inner side surface of the lens barrel.

4. The under-display camera assembly according to claim 3, wherein, the iris diaphragm includes a first lens holder and a plurality of movable blades installed on the first lens holder, and an upper surface of the movable blade has a reflective film, and the reflective state is achieved by closing the plurality of movable blades together, and the transmission state is achieved by accommodating the plurality of movable blades in the first lens holder.

5. The under-display camera assembly according to claim 4, wherein, a top surface of the first lens holder bears against a bottom surface of the organic light-emitting diode display screen, and a bottom surface of the first lens holder bears against a top surface of the lens barrel.

6. The under-display camera assembly according to claim 3, wherein, the lens barrel includes:

a lens group installation section, the lens group being installed on an inner side surface of the lens group installation section; and an extension section, which is formed by extending upward from a top portion of the lens group installation section, and a top surface of the extension section bears against the bottom surface of the organic light-emitting diode display screen.

7. The under-display camera assembly according to claim 6, wherein, the iris diaphragm is installed on the extension section.

8. The under-display camera assembly according to claim 6, wherein, the iris diaphragm is installed on the bottom surface of the organic light-emitting diode display screen, and there is no gap between an outer side surface of the iris diaphragm and an inner side surface of the extension section, or the gap between the outer side surface of the iris diaphragm and the inner side surface of the extension section is blocked by a black object.

9. The under-display camera assembly according to claim 5, wherein, a height of the first lens holder is determined based on a total optical length of the camera module, and a distance from a photosensitive surface of the camera module to a bottom installation surface of the camera module, and a distance from the bottom installation surface of the camera module to the bottom surface of the organic light-emitting diode display screen, and the height is a size in an optical axis direction of the camera module.

10. The under-display camera assembly according to claim 6, wherein, a height of the extension section is determined based on the total optical length of the camera module, the distance from the photosensitive surface of the camera module to the bottom installation surface of the camera module, and the distance from the installation surface of the camera module to the bottom surface of the organic light-emitting diode display screen, and the height is a size in the optical axis direction.

11. The under-display camera assembly according to claim 6, wherein, the organic light-emitting diode display screen has a back plate, and the bottom surface of the organic light-emitting diode display screen is a bottom surface of the back plate, or a position of the back plate corresponding to under-display camera area is removed, and the bottom surface of the organic light-emitting diode display screen is a bottom surface of the organic light-emitting diode display screen exposed after the back plate is removed.

12. The under-display camera assembly according to claim 6, wherein, a top portion of the extension section has an expansion portion formed by extending along a radial direction, so that a width of the top surface of the extension section is larger than an average thickness of the extension section, and the radial direction is a direction perpendicular to the optical axis, and the width of the top surface is a size of the top surface in the radial direction.

13. The under-display camera assembly according to claim 1, wherein, the iris diaphragm includes a MEMS micro-mirror or a highly elastic reflective film.

14. The under-display camera assembly according to claim 1, wherein, a pixel pitch of the under-display camera area is set to be greater than a pixel pitch of the non-under-display camera area, and the pixel pitch is a pitch between light-emitting structures of adjacent pixels of the organic light-emitting diode display screen.

15. The under-display camera assembly according to claim 1, wherein, the under-display camera assembly further includes a first control unit, which is used to control both of the under-display camera area and the non-under-display camera area to display images under the non-working state of the camera module, and to control a display function of the under-display camera area to be turned off under the working state of the camera module.

16. The under-display camera assembly according to claim 1, wherein, the under-display camera assembly further includes a second control unit, which is used to compensate brightness of the under-display camera area when both of the under-display camera area and the non-under-display camera area display images.

17. The under-display camera assembly according to claim 1, wherein, the under-display camera assembly further includes a second control unit, which is used to compensate a display parameter of the under-display camera area when both of the under-display camera area and the non-under-display camera area display images, so that the displayed image transits smoothly between the under-display camera area and the non-under-display camera area.

18. A terminal device, characterized by comprising the under-display camera assembly according to claim 1.

19. The terminal device according to claim 18, wherein, the camera module is used as a front camera module of the terminal device, and the organic light-emitting diode display screen is used as a display panel on the front of the terminal device.

* * * * *